United States Patent
Retsky

(10) Patent No.: US 6,614,151 B2
(45) Date of Patent: Sep. 2, 2003

(54) METHOD AND APPARATUS FOR DEFLECTING AND FOCUSING A CHARGED PARTICLE STREAM

(76) Inventor: Michael W. Retsky, 237 Strobel Rd., Trumbell, CT (US) 06611

( * ) Notice: Subject to any disclaimer, the term of this patent is extended or adjusted under 35 U.S.C. 154(b) by 0 days.

(21) Appl. No.: 09/809,509

(22) Filed: Mar. 15, 2001

(65) Prior Publication Data

US 2003/0111948 A1 Jun. 19, 2003

Related U.S. Application Data

(60) Division of application No. 09/177,834, filed on Oct. 23, 1998, now Pat. No. 6,232,709, which is a continuation-in-part of application No. 08/623,918, filed on Mar. 28, 1996, now Pat. No. 5,825,123.

(51) Int. Cl.[7] ............ H01J 29/50; H01J 29/46
(52) U.S. Cl. ............. 313/364; 313/413; 313/444
(58) Field of Search ............ 313/364, 411, 313/413–414, 421, 426–427, 428, 432, 434–437, 439, 444; 315/14–15, 27 GD, 22, 382; 348/325–331, 806–807, 745–747; 350/3.75

(56) References Cited

U.S. PATENT DOCUMENTS

| | | | |
|---|---|---|---|
| 2,108,091 A | 2/1938 | Von Ardenne |
| 2,137,202 A | 11/1938 | Federmann |
| 2,157,303 A | 5/1939 | Penrose et al. |
| 2,191,415 A | 2/1940 | Schlesinger |
| 2,817,044 A | 12/1957 | Hinderer |
| 2,905,854 A | 9/1959 | Rado |
| 2,911,557 A | 11/1959 | Mollen et al. |
| 3,142,779 A | 7/1964 | Wendt |
| 3,150,284 A | 9/1964 | Comeau |
| 3,185,880 A | 5/1965 | Goldberg |
| 3,772,553 A | 11/1973 | Balint et al. |
| 3,949,262 A | 4/1976 | Ohkoshi et al. |
| 4,137,479 A | 1/1979 | Janko |
| 4,142,132 A | 2/1979 | Harte |
| 4,207,492 A | 6/1980 | Tomison et al. |
| 4,249,112 A | 2/1981 | McKibben |
| 4,319,163 A | 3/1982 | Chen |
| 4,728,855 A | 3/1988 | Kakizaki |
| 4,899,091 A | 2/1990 | Odenthal |
| 5,117,152 A | 5/1992 | Duwaer et al. |
| 5,825,123 A | 10/1998 | Retsky |
| 6,232,709 B1 * | 5/2001 | Retsky .................. 313/364 |

OTHER PUBLICATIONS

Retsky, M., "Observed Single Atom Elastic Cross Sections in a Scanning Electron Microscope," Optik, 41:127–142, 1974.

Hilary Moss, "Narrow Angle Electron Guns and Cathode Ray Tubes," Academic Press, NY 1968, p. 113, p. 116.

(List continued on next page.)

Primary Examiner—Vip Patel
Assistant Examiner—Joseph Williams
(74) Attorney, Agent, or Firm—Adams & Wilks

(57) ABSTRACT

A method and apparatus is disclosed for electrostatic deflection and focusing of a charged particle stream. The apparatus can include plural vertical and horizontal deflection plates, although a single vertical and a single horizontal deflection plate each with a reference potential plane are preferred. Both orthogonal and preferably tilted display screens are employed to receive the deflected beam. The particle stream is injected offset from a centered position and the stream is deflected asymmetrically relative to the attracting deflection plate. Two alternately preferred computer programs are employable to calculate an offset position. A preferred external quadrupole is employed to correct any residual astigmatism in the particle stream. In one embodiment, the apparatus is disposed in a cathode ray tube. A reduced footprint CRT is also disclosed. Methods and apparatuses for an energy filtered electron beam, a mass spectrometer and a mass separator are also disclosed.

16 Claims, 7 Drawing Sheets

OTHER PUBLICATIONS

Schlesinger K., "Progress in the development of Post–Acceleration and Electrostatic Deflection," Proceedings IRE, p. 659, 1956.

Hutter R.G.E., "Electron Beam Deflection," Part I, J. Appl. Phys., 18:740–758, 1947 and Part II, J. Appl. Phys., 18:797–810, 1947.

Kelly J., "Theoretical Aspects of Electrostatic Electron Beam Deflection," Stanford Research Institute monograph, Aug. 1972.

Tsukkerman I., "Electron Optics in Television," Pergamon Press, Oxford, 1961, p. 218.

Kanaya and Baba, "A Method of Correcting the Distorted Spot Shape of a Deflected Electron Probe by Means of Dynamic Focusing and Stigmator," J. Physics D., Sci Instr., 415–426, 1980.

Karssemeijer N. et al., "Spatial Resolution in Digital Mammography," Investigative Radiology, 28:413–419, 1993.

Stix G., "Towards "Point One"," Sci Am 90–95 Feb. 95.

Schwartz J., "Space Charge Limitation on the Focus of Electron Beams," RCA Review, 18:3 (1957).

Castiglione–Gertsch, M., "Duration and Reintroduction of Adjuvant Chemotherapy For Node–Positive Premenopausal Breast Cancer Patients," International Breast Cancer Study Group, pp. 1–20, 1996.

Retsky, M. et al., "A New Paradigm for Breast Cancer," University of Colorado, vol. 127, 1993.

P. Grivet, Electron Optics, Pergamon Press, Oxford, 1965, p. 424.

P. Grivet, Electron Optics, Pergamon Press, Oxford, 1965, p. 134.

M. Retsky, Electrostatic Deflection aberrations Revisited: Solution Proposed To An Old Problem, JVST 15(6) Nov./Dec. 1997.

J. Hasker, Short Length Oscilloscope Tubes With A High Deflection Sensitivity By Bending The Electron Beam, Philips Res. Repts. 22:419–442, 1967.

* cited by examiner

DEFLECTION OF PARALLEL RAYS VS YSTART

ANALYSIS OF DEFLECTION OPTICS PARALLEL BEAM INPUT

DEFLECTED SPOT DIAMETER VS PLATE VOLTS
STATIC AND DYNAMIC BEAM OFFSET
■       □

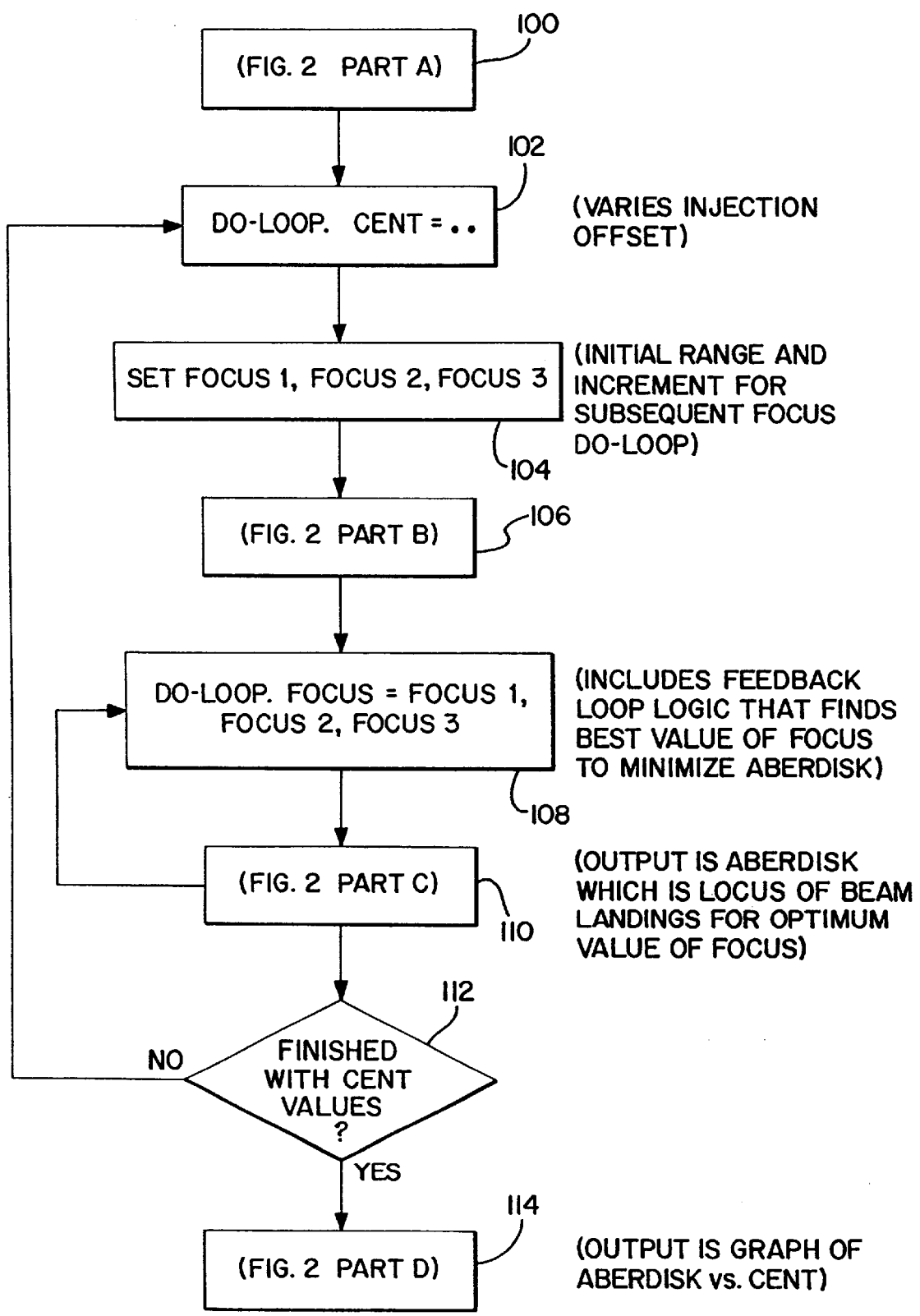

METHOD AND APPARATUS FOR DEFLECTING AND FOCUSING A CHARGED PARTICLE STREAM

RELATED APPLICATION

This application is a division of application Ser. No. 09/177,834, filed Oct. 23, 1998, now U.S. Pat. No. 6,232, 709 incorporated by reference herein. The entry of the specifications for each of these prior applications is hereby incorporated by reference herein.

This application is a continuation-in-part of application Serial No. 08/623,918, entitled Method and Apparatus for Deflecting a Charged Particle Stream, filed Mar. 28, 1996, now U.S. Pat. No. 5,825, 123, the contents of which are hereby incorporated herein by reference.

MICROFICHE/COPYRIGHT REFERENCE

An Appendix is included in this application that contains material which is subject to copyright protection. The copyright owner has no objection to the facsimile reproduction by anyone of the Appendix, as it appears in the Patent and Trademark Office patent files or records, but otherwise reserves all copyright rights whatsoever.

BACKGROUND OF THE INVENTION

In applications of electron optics, it is often desirable to create small, bright focused spots. There are many factors that can limit the ability to finely focus an electron beam. Some of the more common ones include spherical and chromatic aberrations, variations in the mass or charge of the beam particles, magnified source size, misalignments of key components, mutual coulomb repulsion of the charged particles in the beam, inadequate magnetic and electrostatic shielding, mechanical vibrations, and deflection aberrations. This invention is primarily directed to the correction of deflection aberrations although some of the other aberrations will come into consideration since they are often linked in practical designs.

Electron beam probes having a diameter of a few Angstroms are possible, but only within a very small scanned field of a few hundred Angstroms. Most applications of electron beams, however, require moving the beam around appreciably more. When a beam is deflected, aberrations of deflection are induced. These deflection aberrations are usually significant and often much larger than the undeflected focused spot size. As those skilled in the art will appreciate, the above holds equally true for electron beams as well as for other charged particle streams.

There are two types of image defects that result from deflection. The first is a field defect that distorts rectangles into pincushion or barrel shapes. The second type of defect causes the focused spot to increase in size. The aberrations that cause the focused beam size to increase are of more concern. Depending on the application, an electron beam designer will usually want perimeter or corner resolution to be the same or at least not significantly worse than resolution at the center of focus. Because deflection aberrations are approximately proportional to the beam diameter and the square of the deflection angle, the designer will often compromise center brightness and resolution in order to make corner resolution and brightness acceptable. This is typically achieved by reducing the diameter of the beam in the deflection region. As a demonstration of the interdependence among the aberrations, this tends to increase space charge repulsion.

There are two ways to deflect an electron beam—transverse magnetic fields and transverse electric fields. One aberration of concern results from different parts of the beam experiencing different deflections due to inherent non-uniformities of magnetic or electric fields in a vacuum. For the same amount of deflection, the coefficient of deflection aberration is larger for electric field deflection as compared to magnetic field deflection. Electrostatic deflection can be modulated at a very rapid rate and requires low power, but electrostatic deflection aberrations can be several times worse than magnetic deflection aberrations. Researchers have tried to reduce electrostatic deflection aberrations since cathode ray tubes first became useful devices early in this century. (Electric field deflection is often called electrostatic deflection whether the activity is static or dynamic.) While some improvements have been demonstrated over the years, a major solution has yet to be satisfactorily identified.

For some applications, charged particle beams are scanned or dynamically deflected. For other applications the beams are deflected statically. Yet other applications include both static deflections and dynamic deflections. The above concerns apply equally to stable deflection, dynamic deflection and combinations of both.

The standard approach to studying deflection aberrations is to approximate solutions to complex integral equations using polynomial expansions of displacement or angle to third and higher order terms. As those skilled in the art will appreciate, these higher order calculations are enormously complicated and typically require equations that fill entire pages. The results of these calculations, however, show that deflection aberrations partially represent quadrupoles, and thus the net effect of deflection aberrations can be reduced by suitable introduction of another quadrupole of opposite polarity. Correcting quadrupoles are well known and are often called stigmators.

A quadrupole produces astigmatism. Astigmatism, unlike most other electron optical aberrations can be either negative or positive. Pure astigmatism can be exactly canceled by another quadrupole of opposite sign disposed elsewhere in the optical stream. The correcting quadrupole could be either magnetic or electrostatic, but should be adjustable in magnitude and orientation. Suitable quadrupole devices are generally known in the art. Quadrupoles can therefore reduce deflection aberrations for both magnetic deflection as well as electrostatic deflection.

In the case of electrostatic deflection, nonuniformities in the deflecting field appear most pronounced near the plate surfaces, and deflection aberrations are considered to be smallest in the exact center between two oppositely charged deflection plates. Because there is no preferred direction to scan the beam, the scan is typically performed equally toward either plate. Thus, in the art of electrostatic deflection, the scan is usually symmetrical and beams are centered between the plates. The distance from the beam to the end of the plates in the direction transverse to deflection is sufficient to prevent edge effect fields from perturbing the deflection. Typically, 0.25 to 0.5 inches is used in the art where beams are centered between the plates and scanned symmetrically using electrostatic deflection. In general, prior known asymmetrical scanning systems have not addressed the correction of deflection aberrations. One solution is disclosed in co-pending application Ser. No. 08/623, 918, the contents of which are hereby expressly incorporated herein by reference.

Assuming that electrostatic deflection aberrations could be totally eliminated, as already indicated, that may not necessarily mean that deflected beams could be focused to an infinitesimally small spot. There are other contributing factors. Of special interest, among these other terms are chromatic aberrations and variations if any in the ratio of charge to mass of the particles. Electrostatic components are particularly known to have relatively high chromatic aberrations. Chromatic aberrations can limit performance in some important applications of electron optical systems and is often a consideration in practical product designs. These aberrations stem from thermal energy differences that exist among the electrons in a beam. These energy differences are on the order of kT, which is Boltzman's constant times the absolute temperature of the material from which the electrons are emitted. For room temperature of ≈300 degrees Kelvin, kT is approximately 0.02 electron volts. For indirectly heated oxide coated cathodes (≈1100 degrees Kelvin), which are normally used in television tubes, the energy spread has a mean value of 0.1 electron volt. For directly heated tungsten filaments (≈2500 degrees Kelvin), the energy spread mean is 0.2 volts. This energy spread can result in an appreciable chromatic aberration that limits performance for many applications.

It is not difficult to estimate the importance of these thermal energies. The thermal energy is randomly oriented and necessarily has transverse and longitudinal components. The transverse component is most troublesome. For example, a 20 kv beam is deflected 10 inches over a throw of 12 inches. Ignoring small relativistic effects at this voltage, the velocity of an electron is proportional to the square root of the energy of the electron. The angular spread of the 20,000 volt beam due to a transverse energy of 0.1 electron volt is therefore $\sqrt{(0.1/20,000)}$ or 0.0022 radians. This angular spread increases to 0.027 inches after 12 inches of throw. Even if all other aberrations are completely eliminated, the thermal spread would cause spot size blur on the order of 0.027 inches.

In the above example, 0.1 volts added to 20,000 volts along the direction of the gun axis (longitudinal component of thermal energy) adds an insignificant 0.00002 inches to the spot size. Despite the fact that hotter cathodes are more copious emitters of electrons, this calculation shows why in critical applications—even those involving very small deflections—lower temperature electron sources are often used. This also shows that correcting chromatic aberrations would be advantageous once deflection aberrations are reduced in a high resolution electron optics system. Equally useful would be a way to filter out the low and high energy electrons from the beam. That would tend to make the electron optical system independent of chromatic aberrations.

CRT displays are important useful products that extensively make use of electron optical technology. Upon comparing the CRT to flat panel display alternatives, the major disadvantage of the CRT is the large horizontal surface area or footprint that the CRT occupies. It is therefore advantageous to reduce this surface area or CRT footprint wherever possible.

While the deflection of electron beams are discussed above, the above concerns apply to positive or negative ion beams as well. Charged ion beams are not used in display devices because of their relatively large inertia, but there are other uses of interest. The applications of ion beams where deflection aberrations are of concern are in lithography, mass separation and mass spectroscopy. In these applications, charged particle beams of finite diameter are deflected and it is desirable that their landing points are independent of where the particular particle is within the beam envelope.

In mass spectroscopy, there are two basic ways to separate ions of different mass. The first method is to determine the time of flight in a line of sight to a target that is oppositely charged compared to the particle. The acceleration and therefore the time of flight is dependent on the charge to mass ratio. This first method does not depend on deflection aberrations because there are no deflections.

The second method is to deflect the charged particle beam with a magnetic or electric field, or both magnetic and electric fields. Ignoring relativistic effects, the forces are proportional to the charge divided by the mass for either electric or magnetic deflection. Particles of different mass will land in different locations in proportion to mass/charge which may be measured and used to identify the ionic mass. The resolving power of a mass spectrometer is the minimum mass difference of the ions that can be determined. This can be limited by deflection aberrations. That is, if identically massive ions, which originate from different locations in the beam envelope, are deflected into different landings it can compromise the resolution of the mass spectrometer. Therefore, in mass spectrometry applications involving deflection of ion beams with magnetic or electric fields, deflection aberrations can be a concern.

It is also sometimes desired to separate a beam of ions of mixed masses. One example where this would be useful is to enrich the concentration of the fissionable uranium isotope U-235 relative to the more common isotope U-238, which is non-fissionable. Electrostatic deflection can be used to accomplish this separation because the ratio of charge to mass is approximately 1% different for these two isotopes. This process, however, would be limited by electrostatic deflection aberrations for the same reasons as discussed for the mass spectrometer.

The prior art lacks the advantage of electrostatic deflection of a charged particle stream without associated deflection aberrations. Overcoming the deflection aberrations inherent in electrostatic deflection systems would allow for greater resolution and control of the particle stream. Such control provides improved display quality for cathode ray tube displays such as televisions and computer monitors, as well as other uses of charged particle streams including a CRT with reduced footprint, an energy filter, a mass spectrometer, and a mass separator.

SUMMARY OF THE INVENTION

In view of the above, the invention provides a method and apparatus for electrostatic deflection and focusing of a charged particle stream. In one aspect of the invention, the charged particle stream is injected between two symmetrical plates, preferably shaped in a non-linear manner. The stream is injected at a predetermined position offset toward the attracting plate from a position equidistant between the two plates. The injection offset position is determinable by two different methods. One method yields an injection offset position that is in the vicinity of the inflection point obtained from a deflection versus offset curve, which is determinable with the use of a first preferred computer program. The other method uses a focusing beam computation using a second preferred computer program. The stream is then deflected statically or dynamically asymmetrically away from the near plate with a maximum deflection angle less than half the maximum deflection angle toward the near plate. Voltages are applied to the two deflection plates equally positive and negative, respectively, relative to the beam or reference voltage in order to deflect the stream. A focus lens and a variable quadrupole are provided prior to deflection to adjust for particle stream astigmatism and focus the stream, and a target substantially orthogonal to the stream is impacted thereby.

In another aspect of the invention, apparatus for filtering the energy spread of a charged particle beam and deflecting the beam is provided. A particle source is included that is operative to aim the particle stream in a substantially undeflected condition offset between at least one pair of symmetrical deflection plates, where the offset position is at a predetermined location based upon stream deflection and stream offset characteristics. The injection offset position is determinable by either of the two methods described above. An aperture is disposed downstream from the at least one pair of deflection plates to intercept charged particles with undesirable energy values. A variable quadrupole and focus lens is also disposed prior to deflection to adjust for particle stream astigmatism and focus the stream.

In yet another aspect of the invention, a mass spectrometer is provided, which includes a charged ion source operative to aim an ion stream in a substantially undeflected condition offset between at least one pair of symmetrical deflection plates. As mentioned above, the offset position is at a predetermined location based upon stream deflection and stream offset characteristics, and is determinable by either of the two methods described above. A detector is provided with spatial resolution disposed downstream from the at least one pair of deflection plates to detect particles with various mass values comprising the ion stream. A variable quadrupole and focus lens is disposed prior to deflection to adjust for ion stream astigmatism and focus the beam.

In a further aspect of the invention, a mass separator is provided for reducing the concentration of undesirable isotopes. The mass separator includes a charged ion source including both desirable and undesirable isotopes, the ion source being operative to aim an ion stream in a substantially undeflected condition offset between at least one pair of symmetrical deflection plates. The offset position is at a predetermined location based upon stream deflection and stream offset characteristics, and is determinable by either of the two methods described above. A collector is disposed downstream from the at least one pair of deflection plates to collect particles with specific mass values emitted from the ion stream. A variable quadrupole and focus lens is also disposed prior to deflection to adjust for ion stream astigmatism and focus the stream.

Correcting the deflection aberrations normally produced by electrostatic deflection of a charged particle stream provides greater control of the stream. More precise deflecting can thus be achieved. A highly focused and controlled particle stream presents a consistent and well defined spot diameter at the point of impact. Such a highly focused and controlled stream can produce higher definition cathode ray tube assemblies for televisions, computer displays and other video monitors. A charged particle stream with limited or reduced deflection aberration can also be employed in other areas requiring such precision including integrated circuit lithography and video display of mammography images.

Once deflection aberrations are corrected, it is possible to use the inherent high chromatic aberration of electrostatic deflection to filter out undesirable energy components of the beam. This is done by first deflecting the beam by a significant amount using the technology described above, then passing the beam through a defining aperture. Since the high energy particles are deflected less and the low energy particles are deflected more than the main energy component of the beam, both high and low energy particles can be intercepted by the aperture element and thus removed from the beam. The advantage is that this effect is accomplished independent of where the particle is within the beam envelope.

This solves several problems for CRTs. With both reduced deflection aberrations and reduced chromatic aberrations, relatively large electron beam deflections produce little optical penalty. This allows that the electron gun no longer need protrude out the back of the CRT aimed toward the screen. This could reduce the CRT footprint by more than a few inches. Since the electron beam is more monochromatic, center spots will have reduced chromatic aberration. Also, horizontal and vertical scanned spots may not have significant chromatic or deflection aberrations. CRT resolution is thus improved in the center due to less chromatic aberration and in the corners due to less chromatic and deflection aberrations. Additionally, hot cathodes which are more copious electron emitters could be employed.

An end stage of this energy filter beyond the defining aperture could also include a separate dynamic deflecting element that serves to inject the beam to the left optimum offset point for left scan and to the right optimum offset point for right scan. This would allow full scan, since the beam is always injected offset toward the attracting plate.

Correcting the chromatic aberrations once the deflection aberrations have been reduced or eliminated provides for greater focus of a charged particle stream. Greater focus of the stream thus allows for the reduction of the spot size. The particle stream can be bent as it passes through a series of deflecting stages. In the case of electron beams, this bending of the beam can reduce the footprint of a CRT by aiming the electron gun other than directly toward the phosphor screen. In conjunction with a beam defining aperture to intercept high and low energy electrons after these beam bending stages, an energy filter can be implemented.

Another application of this technology is to use the deflection aberration corrector to make a mass spectrometer and a mass separator for charged particle beams. Since deflection is essentially linearly related to the ratio of charge to mass, particles with the same charge but different mass will be deflected by different amounts. Again, the use of this deflection invention has the advantage that the effect is independent of where the particle is within the beam envelope.

These and other features and advantages of the invention will become apparent upon a review of the following detailed description of the presently preferred embodiments of the invention, taken in conjunction with the appended drawings.

BRIEF DESCRIPTION OF THE DRAWINGS

FIG. 10 is a flowchart of one presently preferred method for optimizing the injection offset for a focusing electron beam.

DETAILED DESCRIPTION OF THE PRESENTLY PREFERRED EMBODIMENTS OF THE INVENTION

Figure 1:
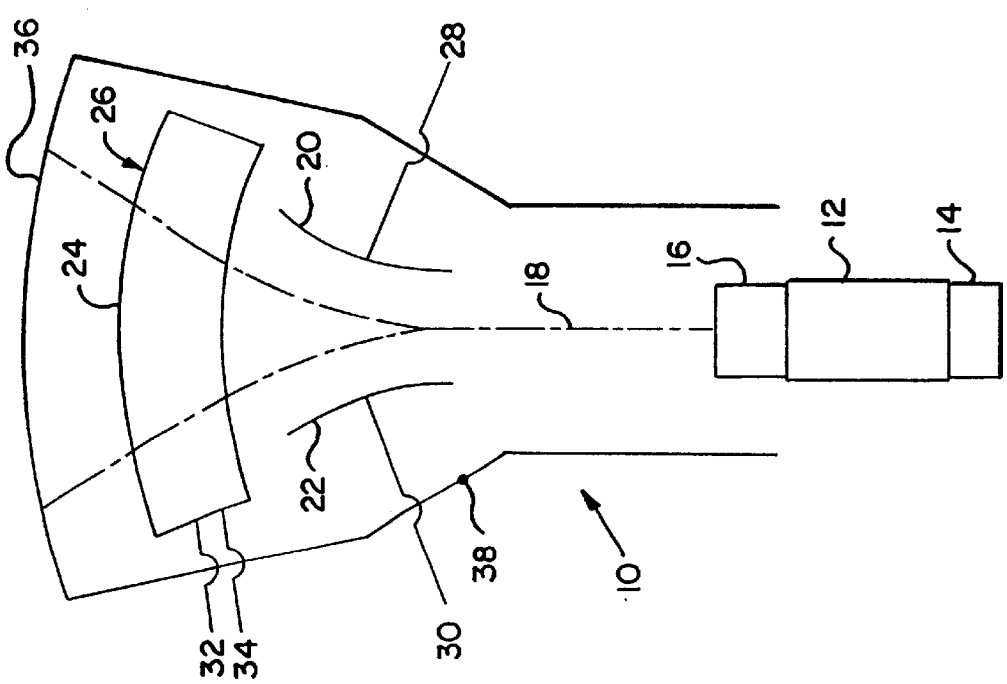
FIG. 1 is a schematic diagram of a conventional electrostatically deflected cathode ray tube showing the path of an electron stream between pairs of deflection plates.

Referring now to the drawings, where like reference numerals refer to like elements throughout, FIG. 1 shows a conventional electrostatically deflected cathode ray tube ("CRT") 10. As those skilled in the art will appreciate, the conventional CRT 10 consists of a vacuum enclosure housing beam controlling components. An electron gun 12 included in the CRT 10 for producing a modulated and focusing stream 18 of electrons is comprised of several elements. The electron gun 12 contains a cathode, control grid and accelerator with beam defining aperture 14 from which electrons are emitted, modulated and accelerated. The electron gun 12 also includes a quadrupole and main focus lens 16. The 15 quadrupole is preferably variable rather than fixed, and the quadrupole and main focus lens 16 is disposed prior to the deflection elements (discussed below). The presently preferred quadrupole for use with the invention is described in greater detail below.

Typically, the electron stream 18 produced by the electron gun 12 is injected between a first deflection plate pair 20, 22 and between a second deflection plate pair 24, 26. Although two deflection plate pairs are preferred, as those skilled in the art will appreciate, one or more deflection plates can be employed within the scope of the invention. After injection, the electron stream 18 is deflected by the first pair of deflection plates 20, 22, which can be the horizontal deflection plates of the CRT 10, and then deflected by the second pair of deflection plates 24, 26, which can be the vertical deflection plates of the CRT 10. The degree by which the electron stream 18 is deflected in any direction depends upon the voltage potential of the vertical and horizontal deflecting signals 28, 30 and 32, 34 applied to the vertical and horizontal deflection plates 20, 22, 24 and 26. The plates 20, 22, 24 and 26 therefore deflect the electron stream 18 to impinge as a spot at a predetermined position upon a downstream target. In the preferred CRT 10, the target can be a fluorescent phosphor viewing screen 36, or the like.

The viewing screen 36 is shown in FIG. 1 as being typically mounted orthogonally to the electron gun 12 or beam that has been stably deflected from the electron gun. However, a canted screen 36 is preferred in one embodiment, as explained in more detail below. As those skilled in the art will appreciate, moreover, other display screens or impact surfaces can be employed without departing from the spirit and essential scope of the invention. For example, other impact surfaces can include a semiconductor integrated circuit or the like.

In practical designs, the deflection plate pairs 20, 22 and 24, 26 are often not parallel and are usually closer together at the point of beam entrance to get high deflection sensitivity and then flared open at the point of beam exit to allow clearance of the scanned beam. A multi-segmented or continuously curved plate configuration can be employed. In the preferred embodiment, four segments are used to make up the deflection plates 20–26 (see FIG. 8). Further, to propel the electrons emitted from the gun 12 toward the screen 36, the envelope of the CRT is electrically coupled to an anode voltage 38, as is known in the art.

In order to compensate for deflection aberrations, the invention provides a method and apparatus to focus the particle stream 18 more precisely, which can be used or applied to an improved CRT 10, or other applicable environment. According to the presently preferred embodiment of the invention, a computer program is provided to ray trace the paths of individual electrons in a vacuum and in the vicinity of a pair of electrically charged (simulated) deflection plates. Using the computer program, an optimal deflection design can be determined for any charged particle stream using the principals of the invention.

Figure 2:
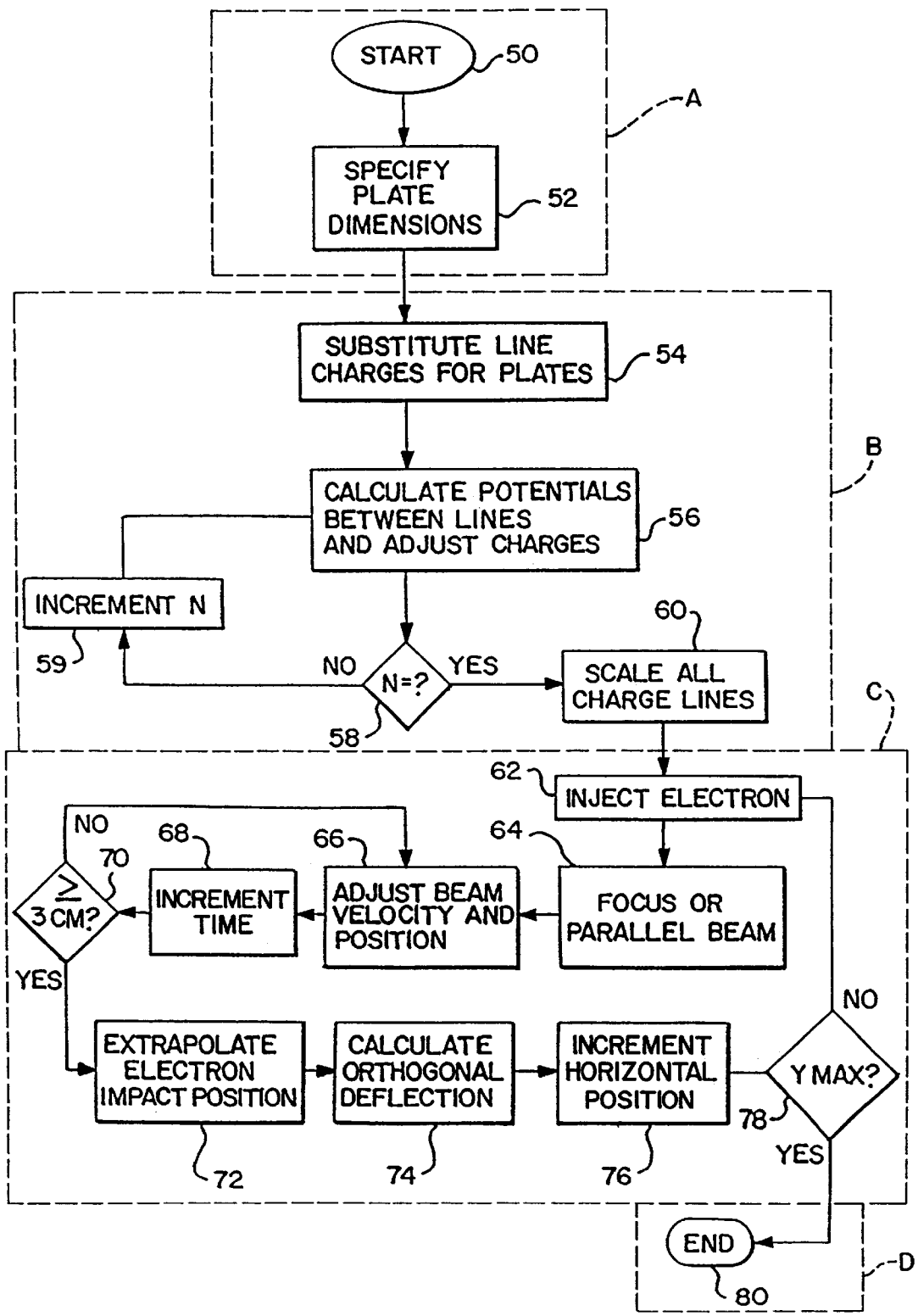
FIG. 2 is a flow chart of one presently preferred method for designing a deflection system according to the invention.

A flow chart showing the steps implemented by the presently preferred computer program is provided in FIG. 2. A computer program written in the FORTRAN computer language that implements the steps shown in FIG. 2 is provided in Appendix A. As those skilled in the art will appreciate, however, the functionality of the invention can be implemented by using any of a plurality of alternative programming languages without departing from the spirit or essential scope of the invention.

Generally, the steps performed by the preferred computer program determine the ideal injection position and scanning of a charged particle stream to compensate for any aberrations of deflection. Because there is no simple analytical expression to describe the electric field in the vicinity of a charged plate, the preferred computer program conceptually replaces the metal deflection plates 20–26 (FIG. 1) with a number of equally-spaced, parallel individual lines of charge. The charge on each line is numerically adjusted by an iterative relaxation process so that the voltage between any two lines is the same. This is done because the voltage remains constant at all points on a conductor when no current is flowing. The program then calculates the charge for each line of charge using a simple model. Once the proper charges on each line of charge are determined, the lines are combined to represent a solid conducting plate. The simulated conducting plates are preferably designed to include up to three bends rather than simple, flat planes. Using a simple analytical expression for the electric field of a line of charge, the electric field vector at any point in space can be determined as the vector sum of the contributions of all the line charges. As those skilled in the art will appreciate, provisions can be added to the program to increase the number of lines of charge as needed to make the calculation more exact. After several hundred lines per inch, however, no appreciable change is detected in the ray trace results obtained using the preferred program. Thus, an approximation that preferably uses 300 discrete lines of charge to represent one inch long plates is sufficient for the required accuracy.

The preferred ray trace program then follows the path of an electron as it is injected and passed through the simulated deflection plates and on to the point of impact on a simulated display screen. The program "injects" a simulated parallel beam of electrons into this area and detects where each simulated electron eventually impacts the screen. (To fully and rigorously characterize an optical system, oblique rays as well as parallel rays should be studied. However, enough information to design an operable deflection system can be obtained from proper analysis of the paths of parallel particles alone.) The program can be altered slightly to focus the entering beam and determine the spot diameter after deflection.

Figure 9:
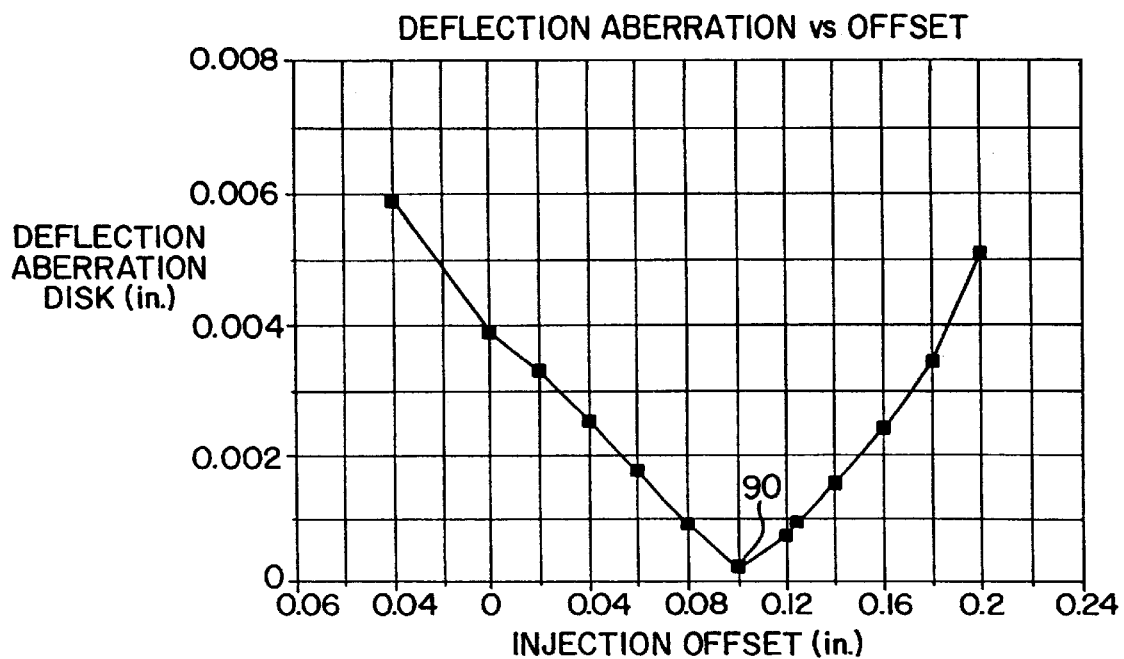
FIG. 9 is a graph showing deflection aberration diameter disk plotted versus beam injection offset for focusing beams.
Figure 11:
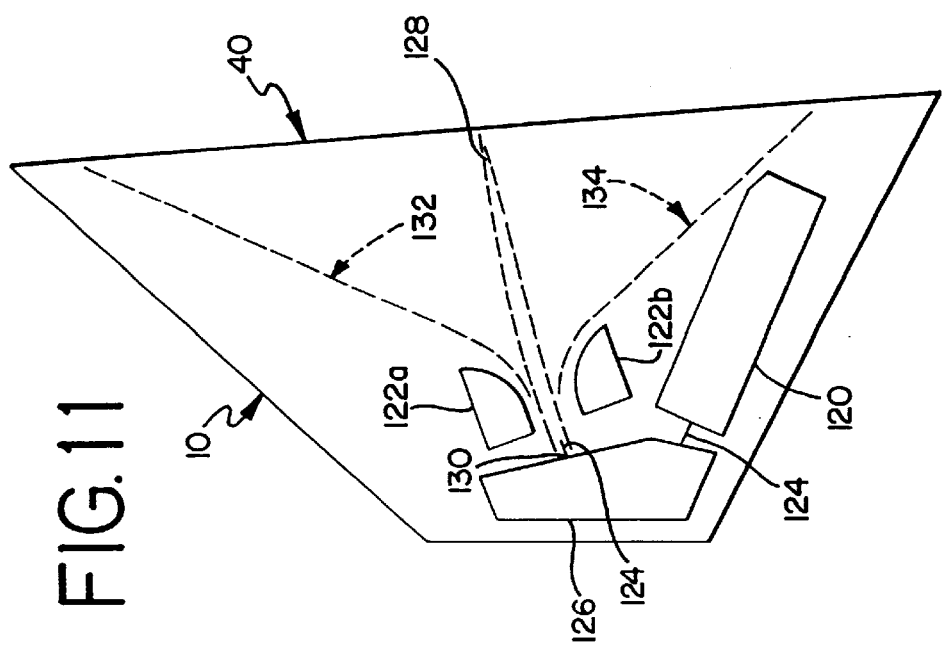
FIG. 11 illustrates a small footprint CRT cross-section and energy filtered electron beam.

An alternate preferred computer program provided in Appendix B is directed to focusing a particle stream and is described in greater detail below in connection with FIGS. 9–11. This alternate program automatically seeks best focus for each offset value. The resulting optimum offset is slightly different from the optimum offset determined by the program in Appendix A.

Injecting a parallel beam of electrons into the simulated deflector assembly and properly interpreting where each electron impacts the target or screen allows for the classification of the deflection aberrations of a prospective electrostatic deflector design. A discussion of the steps performed by the presently preferred ray trace program shown in Appendix A is provided below.

Referring now to FIG. 2, the presently preferred computer program for implementing the above functions begins execution at step 50. The program then proceeds at step 52 to specify simulated plate shapes, beam voltage, plate voltage, and distance (s2) to a simulated screen. The program preferably performs its calculations in MKS units, but the printout of all output is provided in inches. (Multiplication by "u" in the preferred program converts inches to meters.)

The program can preferably operate in two different modes—parallel rays or focusing rays. In the program provided in Appendix A, parallel ray mode is used. (Focusing ray mode is the subject of the program in Appendix B.) At step 54, each plate is replaced with 300 equally spaced (projection on the x axis) parallel lines of charge, the values of each of these individual charges are set at step 54 to an arbitrary initial value that will be adjusted later. The program then calculates at step 56 the potential at a point midway between each of the 300 lines of charge and each of its adjacent lines of charge. A subroutine is preferably called that accepts an x coordinate and returns a y coordinate in accordance with the plate shape. After the first iteration each charge is increased or decreased (step 56) if the potential on each side of the line is too low or too high. The contributions from the 300 lines on each plate are all considered at step 56.

The above process is preferably repeated 100 to 1000 times. After each iteration, the largest fractional error in potential is printed with the corresponding line charge location. A slow but steady decrease in largest fractional error is noted with each additional iteration (step 59). For the example presented below, at the end of 10 iterations the largest fractional error is 0.02; at the end of 50 iterations it is 0.002; after 100 iterations it is 0.0001; and after 1000 iterations the largest fractional error is 0.00001. All charges are then scaled at step 60 so that the potential between any two adjacent lines of charge is acceptably close to the desired value. Taken together, all the line charges can then be used to represent a conducting surface with the specified shape and at the specific voltage.

Beginning at step 62, electrons of an energy level V5 volts are injected one at a time into the gap between the simulated plates. The starting x value (how far before the plate entrance the electron ray trace starts) is set at step 64 to be preferably 1.0 cm (xstart=0.01) or more. The starting y value (ystart) and beam width are specified by a do-loop at step 64, and the beam velocity (v) is calculated with a relativistically correct expression. The starting velocity in the y direction (v2) is zero if the rays are injected in a parallel manner (focus=0). If the ray is injected at an angle proportional to the distance from the beam center, the rays are focussed according to the following formula:

$$v = 2.9979e8*(1-1/(1+v5/511000)2)0.5$$

$$angle = ((ystart/u - 0.125)/0.025)*focus$$

$$v1 = v*\cos(angle)$$

$$v2 = v*\sin(angle)$$

With the values obtained from the above formula, a beam 0.050 inches wide centered at 0.125 inches offset from the plate pair center is focused toward the simulated screen according to the value of the "focus" variable. The focusing algorithm represents the first order property of a focusing lens. In practice, the best beam focus is numerically determined by varying the value of the "focus" variable and evaluating the resulting variations in beam landing positions using a spreadsheet, or the like. This is automatically done by the alternate computer program in Appendix B. (in the preferred computer program provided in Appendix A, the output files are written with commas separating the fields to readily facilitate importing the data into a spreadsheet.)

The program next calculates electric fields at the current position of each electron. The electric fields from each of the 300 line charges on each plate are summed vectorially. Velocity and position of the electron are adjusted in each time increment (step 66) according to successive integrals of force equals mass times acceleration (e.g., F=mA). The time increment (h) (step 68) preferably varies randomly from electron to electron as a precaution to prevent systematic errors from possible harmonic beating with the lines of charge. While the electron is within the gap between the plates, the clearance to one plate is noted for later printout. If the electron strikes the plate surface, that is also noted and that ray is terminated.

Each ray trace is continued until the electron is 3.0 cm beyond the end of the simulated plate (step 7) at which time a straight line extrapolation is used at step 72 to calculate where the electron would impact the simulated screen. The deflection (s3) and the angle of impact are noted. A center of deflection is calculated at step 74 by extrapolating the ray back to the y=0 axis. Because the usual operation of two-dimensional electrostatic deflection employs two sets of plates oriented in mutually orthogonal directions, the program calculates the orthogonal deflection that would be produced by a second set of plates located 0.5 inches away from the first set of plates. The previously calculated center of deflection of the first set of simulated plates is then used as the center of curvature for the second set of simulated plates. The second set of deflection plates is a surface of revolution with a cross-section having the same shape as the first set of plates. A new electron is then injected at an incremented start value at step 76 and the above ray trace calculations are resumed until the program reaches a predetermined horizontal offset limit at step 78. The program then halts operation at step 80.

By plotting the impact points of each electron with the screen versus the injection position of a beam injected parallel to the center line between the deflection plates, the type of aberration present in a particular CRT design can be determined. If the slope of deflection versus offset is a straight line with slope of one, there would be perfect deflection. That is exact transformation from object to image. With that condition, if a round parallel beam were injected into the deflection area, a round parallel beam would impact the screen, which could then be focused down to a small spot with a good focusing lens. A straight line of slope greater or less than one is typical of what a quadrupole-like aberration would produce. Therefore, if a properly designed electrostatic deflection system can be made to produce only quadrupole-like aberrations, it can be corrected by an induced, but oppositely charged, quadrupole located prior to deflection as explained below.

A quadrupole employed to counteract or cancel the quadrupole-like deflection aberrations must be of sufficient magnitude, proper orientation and opposite polarity to perform properly. The induced opposing quadrupole can be generated by either an externally or internally mounted coil, or by an internal electrically charged device or the like. The canceling circuit can be either an electrostatic or magnetically powered device to produce the desired opposing quadrupole and is preferably capable of variable direction and intensity. As those skilled the art will appreciate, other harmonic-like deflection aberrations can be accounted for by the appropriate N-pole compensator.

With an induced quadrupole-like deflection aberration, the deflection process would transform an injected round parallel beam into an elliptical beam at the screen. This elliptically shaped beam could then be focused to a small spot with a focusing lens plus an opposing quadrupole of the type addressed above. As mentioned, the most desirable condition is a linear deflection versus offset plot. If that is not presented by the considered design of the deflection system, the most linear segment of a complex curve would identify the next best location for injection of the electron beam. Typically, that position is at an inflection point 42 along the deflection versus offset curve produced by the preferred computer program.

Figure 3:
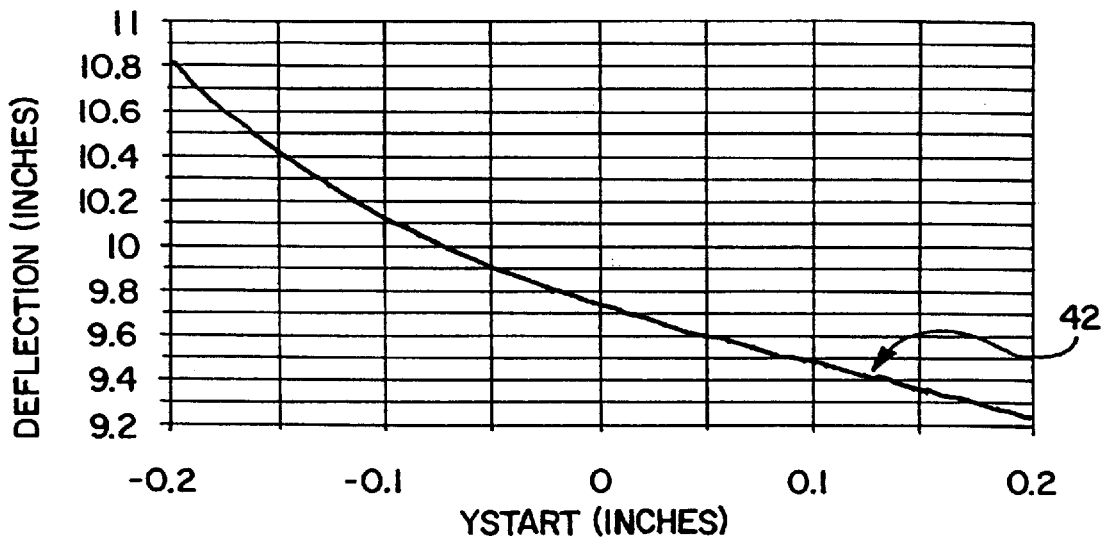
FIG. 3 shows the calculated deflection of individual electrons injected into a one-dimensional deflection system.
Figure 4:
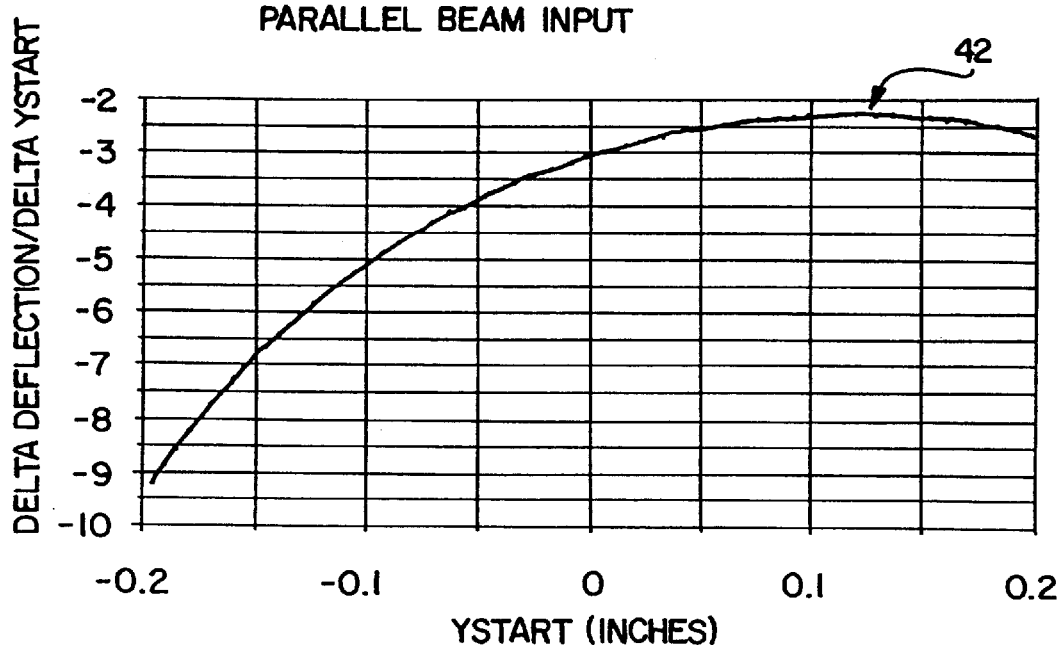
FIG. 4 shows a graph of the derivative values of the data received from FIG. 3.

Referring now to FIG. 3, the deflection versus offset calculation performed by the program provided in Appendix A results in a complex curve that includes an inflection point 42. The mathematical derivative of the curve shown in FIG. 3 is presented in FIG. 4. The derivative plot makes the inflection point 42 more readily observable. The vicinity of this inflection point 42 marks the most linear segment of the deflection versus offset curve and thus indicates where any observed deflection aberrations would be most correctable. Accordingly, the best positioning of a charged particle beam to minimize deflection aberrations in a particular deflection system design is in a position offset from the center line by the value of the inflection point 42. In the example shown in FIGS. 3 and 4, this position appears as slightly less than half the distance from the center line to one deflection plate in the design of the CRT 10. Thus, the electron gun 12 should be positioned to inject the beam 18 at a starting position offset by the value shown by the inflection point 42 with respect to both deflection plate pairs 20, 22 and 24, 26 (see FIG. 8).

Figure 8:
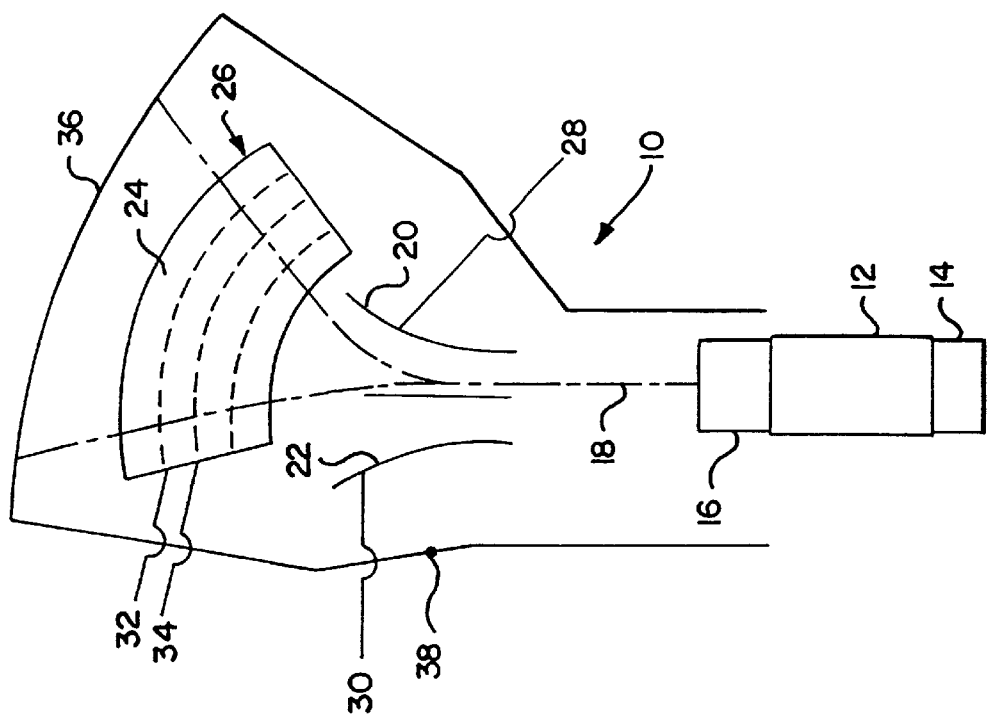
FIG. 8 shows one presently preferred cathode ray tube made according to the principles of the invention.

To further improve the beam and account for any deflection aberrations, the beam can be preferably scanned on the side toward the nearer of two deflection plates. As shown in FIG. 8, the beam 18 is therefore scanned asymmetrically toward the side of each deflection plate pair 20, 22 and 24, 26 closest to the offset position of the electron gun 12. If the beam were scanned symmetrically toward the far plate, the aberrations on that side would be similar to or worse than a normally-centered beam. Thus, deflection aberrations of a target system can be reduced significantly by (1) injecting the beam into the deflection plate gap with a specific off-center displacement that is located at the inflection point 42 of the deflection versus offset curve (see FIG. 3), (2) scanning the beam asymmetrically toward the nearer of two deflection plates, and (3) correcting the residual aberration with a variable quadrupole. Alternatively, performing a full scan towards the near plate and scanning up to approximately 25% away from the near plate still produces significant advantages over the typical symmetrical scan. (To fully scan in both directions, the beam must be redirected to be offset on the opposite side of the centerline as well.) Any induced beam astigmatism can then be corrected using a quadrupole device in the manner described above. A plate can be replaced by another plate that takes the shape and voltage of an equipotential surface as long as it does not intercept the particle beam.

According to one presently preferred embodiment, a reference voltage virtual center plane can also be used, which should extend beyond the deflection plates 20–26 (FIG. 8). In addition, although in the preferred embodiment the driven plate is not flat but curved or segmented, the reference voltage plate should be preferably flat. The use of such a center plate (not shown) allows two to four separate beams to be simultaneously used in the same envelope. That is, multiple beams separated by horizontal and vertical center planes that are separately driven can be used, where each beam is directed to a section of the display screen 36 such as a quadrant, etc. One example of a deflection design made according to the invention (described below) achieves a 3.9-fold reduction in deflected spot diameter (to a diameter of 0.0011") over a scan field of 9.70'×8.24" on a display screen 36 disposed 12" from the deflection entrance. With a further refinement over a smaller scan field of 6.32"×5.37" at the same 12" screen distance, the deflected spot size can be reduced to the resolution limit of the above calculations (approximately 0.0001" for this case) through a process of dynamically adjusting offset with scan voltage (discussed below). The above proportions can yield as many as 57,400 by 48,800 pixels on a display screen 36 and a corresponding 13-fold reduction in spot diameter.

An optimum CRT design can thus be determined through the calculations performed by the method described above and embodied in the computer program in Appendix A. One example of a low deflection aberration electrostatic deflection system suitable for display of mammography images is presented below.

| Plate | Shape | Operating Parameters |
| --- | --- | --- |
| x | y | 20 kv beam voltage |
| 0 | 0.3 | −2 to +8 kv deflection plate drive voltage |
| 0.2 | 0.34 | 12.0" plate entrance to screen |
| 0.4 | 0.4 | |
| 0.7 | 0.55 | |
| 1.0 | 0.7 | |

The values shown in the above example were chosen using the computer program in Appendix A to provide reasonable clearance to the scanned beam. Using these parameters, the resulting deflection versus ystart for a parallel beam injected into the plate gap with an 8.0 kv potential on the deflection plates is shown in the plot of FIG. 3.

The general shape of the data presented in FIG. 3 is in the format of an S-shaped curve with a subtle inflection point 42 between 0.10 and 0.15 inches. The inflection point 42 detected in FIG. 3 is more obvious in the derivative graph of FIG. 4. As can be better seen in FIG. 4, the inflection point 42 for the above CRT design is located at ystart=0.125 inches where there is a reasonably flat section of the curve. Thus, the best offset location for the electron beam 18 in this design should be placed at y=0.125 inches so that a proper lens and quadrupole can be employed to correct the induced deflection aberrations at full scan. Were the beam to be scanned away from the near plate, it would be equivalent to centering the beam at ystart=−0.125 inches (FIG. 4) and the deflection aberrations would be less correctable.

Figure 5:
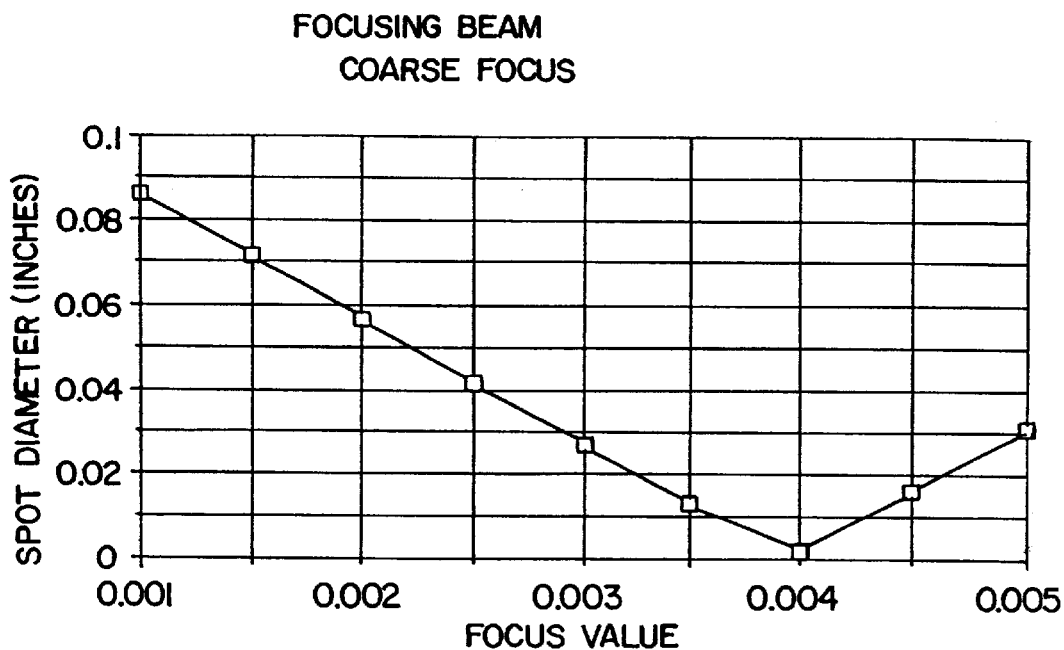
FIG. 5 is a graph showing deflected spot diameter as focus is varied coarsely for an optimally offset beam.
Figure 6:
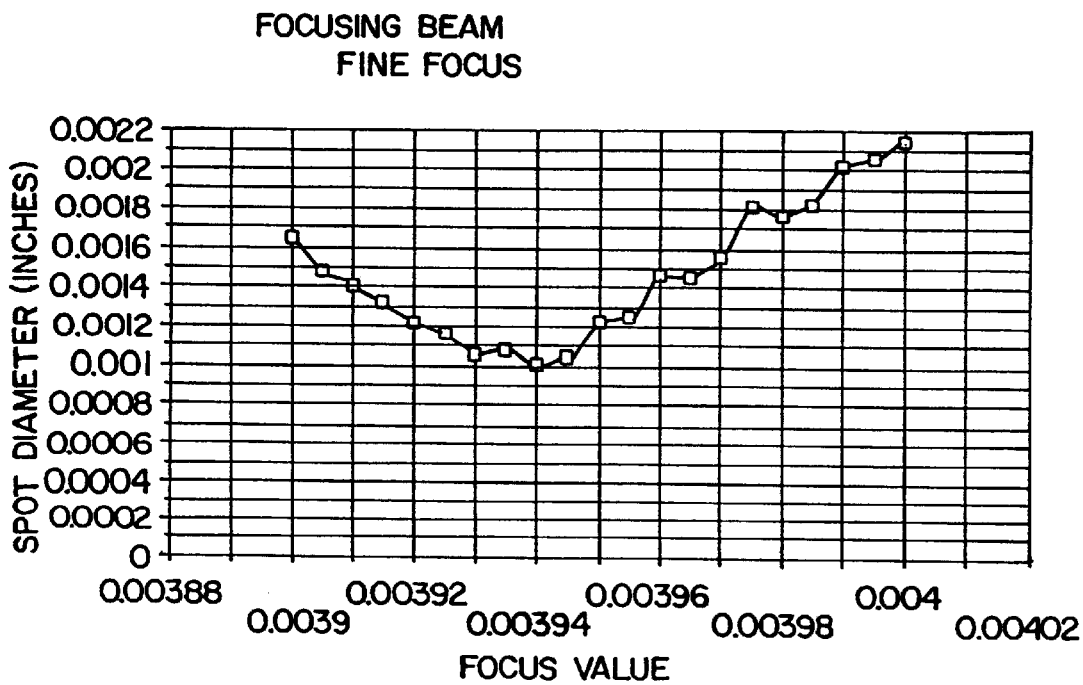
FIG. 6 shows the same illustration as in FIG. 5 where focus is varied finely.

Using the preferred computer program to focus the beam under various conditions confirms the above operations and also confirms that a 0.050 inch wide beam is preferred. Coarse focus variation of the beam is shown in FIG. 5 and fine focus is shown in FIG. 6. With the beam injected off center by 0.125 inches, the focussed spot diameter due to deflection aberrations is less than or equal to 0.0011 inches over the entire field. In the preferred design, the deflection angle is 38.13 degrees toward the near plate and 9.53 degrees away from the near plate for a total scan angle of 47.66 degrees.

Figure 7:
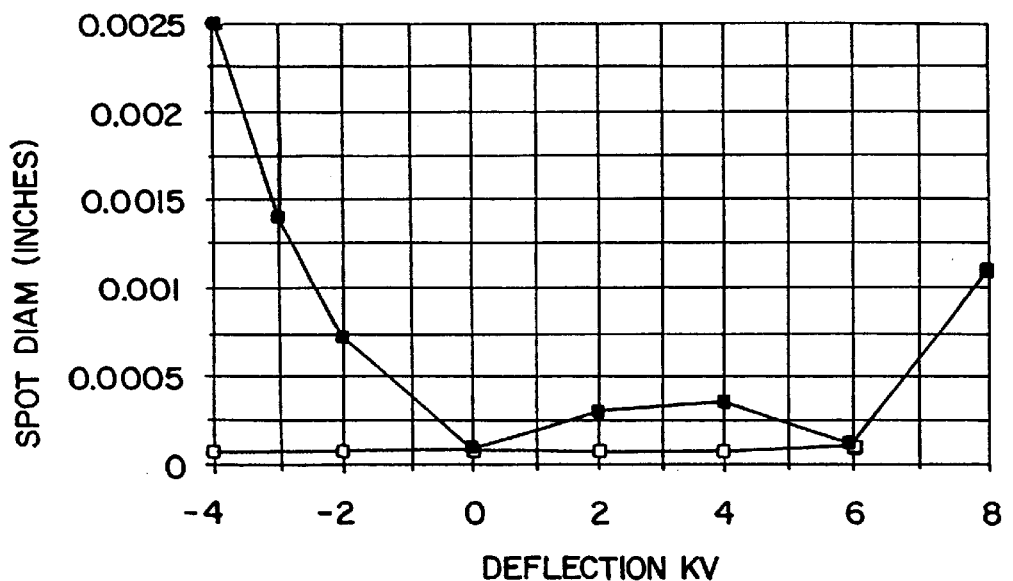
FIG. 7 is a graph showing focused spot diameter versus deflection voltage.

FIG. 7 presents a graph showing the deflection aberration spot diameter versus deflection voltage. Scan limits of −2 kv to +8 kv were chosen to keep the spot diameter less than or equal to 0.0011 inches. As reflected in FIG. 7, the spot diameter for negative deflection voltage can be described by a quadratic equation. The standard measure of fit, R2, is 0.999. The quadratic equation therefore is spot diameter (in inches)=0.000104+0.000149*deflection voltage (in kv) squared. Because it is not a monotonic function of deflection voltage, the variation of spot size with positive deflection voltage is not describable by a quadratic equation. The focused spot diameter at +6 kv is smaller than the spot diameter at +2 kv or +4 kv. This is because the inflection point varies with deflection voltage.

While the inflection point is 0.125 inches with 8 kv deflection voltage, the inflection point changes to 0.160 inches with 4 kv deflection voltage and to 0.210 inches with 2 kv deflection voltage. Thus, the optimum offset position for the election beam depends on the particular scan voltage used. Using the above-described calculations and techniques, zero deflection aberrations are observed over a 30.5 degree scan if the beam offset position dynamically as deflection voltage changes.

One presently preferred embodiment of an optimum CRT 10 design is shown in FIG. 8. The display screen 36 shown in FIG. 8 is tilted relative to the deflection assembly so that the center of scan is normal to the screen 36. The full horizontal deflection can be expressed as 24*sin (38.13*1.25/2), or 9.70 inches. The extrapolated center of horizontal deflection is 0.2 inches. The presently preferred four segmented vertical deflection surfaces are also shown in FIG, 8. The resulting calculated vertical deflection is 8.24 inches with 0.5 inches between horizontal and vertical deflection plates. Combining deflection limiting spot size and space charge spot size in quadrature, the resulting spot diameter (at 60 microamps) is 0.00126 inches. The resulting number of pixels that are created thereby is 7682 horizontal pixels by 6722 vertical pixels (scan dimension divided by spot diameter).

Further improvements in deflection system designs can be obtained by also considering gun and source aberrations, which will reduce the number of resolvable pixels. To some extent the spherical aberration of the focusing lens will be compensated by deflection focusing, but that effect has not been considered in the above calculations. The deflection aberrations are opposite in effect to the spherical aberration of the focusing lens and thus mitigate the net spherical aberration of the lens. In another aspect of the invention, further reductions in deflection aberrations are achieved by varying the injection offset dynamically with deflection rather than with the use of a static placement for all deflections. The optimum injection offset is obtainable with the preferred computer program. Offsetting the beam 0.125 inches from center resulted in a 3.9-fold improvement in focused spot diameter. Some deviations from a linear deflection versus offset design could be tolerated, however.

Taking the spherical aberration of the focussing lens into consideration, there is a certain amount of acceptable or even desirable deviation from a straight line plot. Spherical aberration of the lens causes electrons in the outer periphery of a beam to have a shorter focal length as compared to electrons located closer to the center of the beam. This produces the familiar spread in spot diameter at best focus because best focus is a compromise between focusing the central beam electrons as well as the periphery beam electrons. To some degree, therefore, if an aberration of deflection acts to counteract the effect of spherical aberration, it may be acceptable or even desirable. If deflection aberrations result in a slight increase in the focal length of periphery electrons, it may be an acceptable variation from linear deflection versus offset if properly matched to the lens spherical aberration.

The deflection system design described above is suitable for a mammography work station since it can display all the information captured and stored on film with similar precision. With minor alterations, the above design methodology is also applicable to integrated circuit lithography applications. Following the above techniques will allow one of ordinary skill to design a suitable deflection assembly for use with any form of target or impact surface that is purposely impacted by a charged particle stream.

An alternate preferred embodiment of the invention injects an optimally focusing rather than a fixed focus or parallel beam into the deflection plate gap. In this alternate preferred embodiment, a variation of the computer program provided in Appendix A is used. This program is provided in Appendix B. Using an algorithm that is highly CPU intensive, the program finds the best focus value for the focus lens to produce the smallest spot diameter for a certain offset. This persistent determination of the smallest focused spot is repeated for a wide range of offset values. As shown in FIG. 9, the best offset value is that which produces the smallest focused spot diameter 90 on a deflection aberration diameter disk plotted versus beam injection offset for focusing beams. Using this technique, the resultant optimum offset is slightly different from that which is obtained using the parallel beam and the inflection point analysis described above. As described in detail below, a smaller CRT footprint is possible by bending the beam after exiting the electron gun and before it is scanned by the horizontal and vertical plates.

The second program shown in Appendix B computes electron beam landings with optimally focusing rays rather than fixed focus or parallel rays as used in the program in Appendix A. Both methods use the same basic ray trace program and have the same computational accuracy. The program numerically calculates the best focus for a wide range of injection offsets. The geometry studied is the same as in the parallel beam method described above.

A flow chart of the computer program included in Appendix B is provided in FIG. 10. The program starts and plate dimensions are specified at step 100. A loop is then started at step 102 that varies injection offset. Initial ranges and increments are set at step 104. A subroutine is performed at step 106 for determining the charge on the deflection plate similar to steps 54–60 shown in FIG. 2. A nested loop is then started at step 108 that finds the best value of focus to minimize aberdisk. Another subroutine is performed at step 110 similar to steps 62–78 shown in FIG. 2, to inject electrons one at a time and calculate their impact position while incrementing the injection offset. At step 112 a test is performed to see if the offset range has been reached. If not, the program loops back to step 102. If the maximum offset has been reached, the output is provided at step 114 in the form of the graph shown in FIG. 9, and the program ends.

The results of running the focusing beam program in Appendix B show that the best injection offset is 33% of the distance from the center to the attracting plate, which is somewhat lower than the 42% found above in connection with the parallel beam program in Appendix A. The calculated magnitude of the improvement over the injection of a beam that is centered is 16 fold using program B. Like the above results from program A, this result from using program B holds true only if the scan is directed toward the attracting or near plate.

Reducing CRT dimensions can be accomplished by using the reduced deflection aberration techniques described above. As described below, with this method the beam can be at least as finely focused as if the gun were protruding out the back of the CRT. Referring to FIG. 11, after being emitted from the electron gun 120 and before entering the scanning deflection plates 122a, 122b, the beam 124 is oriented so as to be injected at the optimum offset obtained from the above calculations. In addition, through the use of an energy filtering deflection mechanism and dynamic injection offset provider 126 the beam 124 is directed to be offset to the left of center 128 when the beam 124 is to be scanned left 132, and is then directed to be offset to the right of center 128 when the beam 124 is to be scanned to the right 134. For a full scan, therefore, the injection point 130 is automatically moved by the energy filtering deflection mechanism and dynamic injection offset provider 126 from left of center 128 while the scan is to the left 132 and then to right of center 128 while the scan is to the right 134.

Figure 12:
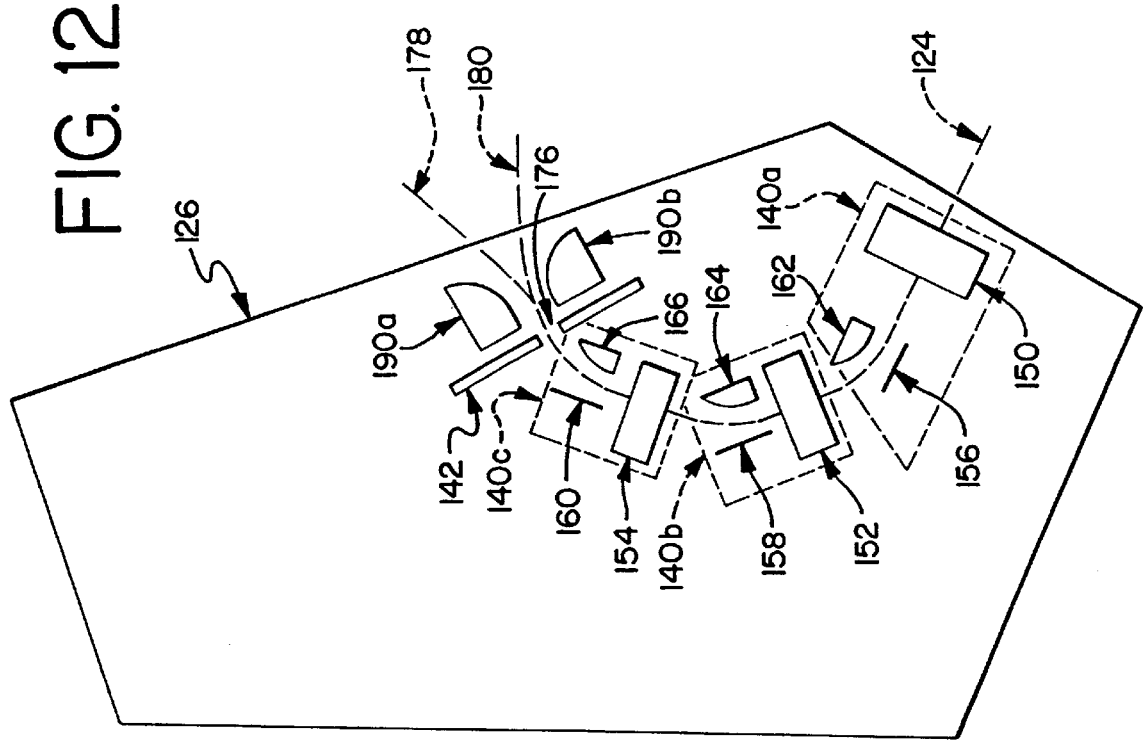
FIG. 12 is an exploded view of the small footprint CRT shown in FIG. 11, showing multiple stage deflection sections, bending the electron beam and dynamic injection offset provider.

Preferably, the energy filtering deflection mechanism and dynamic injection offset provider 126 is comprised of a plurality of deflection stages 140a–c, as shown in FIG. 12. By breaking up the deflection mechanism into multiple stages 140a–c, the CRT footprint can be reduced by injecting the beam 124 from the electron gun 120 at a position other than the bore sight of the deflection plates 20, 22 and target 36 (see FIG. 1). Bending the beam 124 in this manner allows for a reduced CRT footprint by eliminating the protrusion of the electron gun 120 from the rear of the CRT 10 (see FIG. 1). The use of multiple deflection stages with an appropriately placed beam defining aperture also helps filter electron energy spread.

An exploded view of the presently preferred series of deflection stages used to reduce the CRT footprint and filter electron energy spread is shown in FIG. 12. The energy filtering deflection mechanism and dynamic injection offset provider 126 shown in FIG. 11 is divided into several deflection plate and focusing stages 140a–c, which allows the beam 124 to be bent and shaped prior to the beam defining aperture 142. Each stage 140a–c comprises its own deflection plate(s) and might include its own focusing element(s). Plates 150, 152, 154 deflect the beam 124 out of the plane of the figure. Plates 156, 158, 160 are flat plates disposed at the beam potential (described above). Plates 162, 164, 166, are positively charged deflection plates. As those skilled in the art will appreciate, however, greater or lesser numbers of deflection stages 140a–c than those illustrated in FIG. 12 can be employed without departing from the spirit and scope of the invention.

The beam defining aperture 142 is strategically placed in the beam path 124 past the first deflection step 140a to intercept and filter out the low and high energy components of the beam 124. In the preferred embodiment, the beam defining aperture 142 is located just past the last deflection stage 140c. The last deflection section 190a–b before the beam 124 enters the scanning deflection gap 122a–b (FIG. 11) is modulated to inject the beam 124 at the optimum offset on each side of the center of the gap between 122a and 122b. The last deflection step 190a–b thus dynamically adjusts the injection offset and automatically shifts the beam 124 injection from one side of the gap between 122a and 122b to the other according to the results of the program in Appendix B. That way, a full symmetrical scan is produced. The beam 124 then passes between the horizontal deflection plate pair 122a, 122b and then through a subsequent vertical deflection plate pair (see FIG. 1).

According to the invention, optimum injection offset for a CRT design is located at the inflection point of a deflection versus offset curve such as determined using the program in Appendix A or a best focus offset such as determined by using the program in Appendix B. Also, the optimum injection offset varies some with deflection magnitude. For the dynamic deflection case described above, optimum offset varies from 42% to 70% of distance from center to the attracting plate as deflection voltage is varied from 8 kv to 2 kv. As those skilled in the art will appreciate, there are applications of the invention where offset is necessarily fixed at a nominal value while deflection varies. This can occur in some scanning applications. There are other cases where the offset needs to be adjusted as deflection changes to achieve the best results. Thus, two cases are contemplated. One with an offset optimized for a nominal value of deflection and the other to allow dynamic variation of offset with deflection. The offset also does not have to be exactly at the proper point to achieve an advantage. If the offset were in the vicinity (perhaps +/−20% of the gap) of the proper point, some benefit would result.

The present invention thus simultaneously solves several problems that are all linked and fortunately have a common solution. These problems are (1) the high chromatic aberration of electrostatic deflection, (2) the large footprint of CRTs, (3) the need to dynamically shift beam injection from one side to the other for full scan, and (4) the most efficient producers of copious electrons are hot cathodes, which produce a large spread of electron energy. The solution is to direct the electron gun other than towards the screen as is traditional. Then, using the electrostatic deflection technology, deflect the beam in one or more steps by approximately 90° before it is eventually injected into the scanning system. This scheme simultaneously causes a smaller footprint CRT, solves the chromatic aberration problem, dynamically optimizes beam injection offset and allows use of a copious, efficient emitter of electrons.

The technique of making a monochromatic charged particle beam would find uses in other electron optical systems since chromatic aberration is a common problem especially when an elevated temperature thermionic source of electrons is used. The optimum injection offset is determined using either version of the programs provided in the Appendices. The target is a conventional means of detecting the impact of accelerated charged particles such as a phosphor screen, charged coupled device (CCD) or the like, or collecting cups as used in calutrons or the like.

Likewise, a mass spectrometer as well as a mass separator can employ the deflection of a beam of ions of various masses. The various masses are distinguishable by the magnitude of deflection. Once deflection aberrations are reduced, ion deflection is essentially proportional to charge/ mass and less dependent on where the particle is within the beam envelope. This can be utilized to determine the energy spectrum of the beam particles as well as to make an efficient mass separator for such applications as to enrich uranium for fission applications.

A mass spectrometer and mass separator can be implemented since charged particles of different masses will undergo different amounts of deflection. In the case of a mass spectrometer, the beam can be repetitiously scanned over the aperture allowing different mass components to sequentially pass through the aperture hole. The visualization of the electronic output of this current versus the scan would produce a mass spectrum. Also, rather than using a simple aperture with one passage hole, a beam landing detector that provides spatial landing information can be used. A microchannel plate, a charge-coupled-device (CCD) or the like can be used for this purpose. A mass separator for separating isotopes of uranium or the like may use an aperture with two or more separate holes to collect the various isotopes.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of this invention.

APPENDIX A

```
c    © 1998 Michael W. Retsky, All Rights Reserved.
c    Depending on how program is set up, it will find best
c    offset position of entering beam or best focus and resulting spot
c    diameter. Input includes beam volts, plate volts, plate geometry,
c    distance to screen, beam width and will find best offset.
c    Using 300 lines of charge per inch.
c    Graphical output office\b1 and \b2 show ray relative to plate and
c    E1,E2 vs xaxis and v2/v1 vs xaxis
c    \b3 has ystart,deflection . . . \b4 has plate information and volts.
c    Language is Fortran 77 from Lahey Computer Systems,
     702-831-2500
         common
         q(300),x0,y0,x1,y1,x2,y2,x3,y3,x4,y4,x6,y6,x8,y8,x9,y9
         open(1, 'C:\office\b1.txt', access = 'sequential', status='old')
         open(2, 'C:\office\b2.txt', access = 'sequential', status='old')
         open(3, 'C:\office\b3.txt', access = 'sequential', status='old')
         open(4, 'C:\office\b4.txt', access = 'sequential', status='old')
         open(5, 'C:\office\b5.txt', access = 'sequential', status='old')
c    For first use of this program, insert "new" instead of "old".
         ak1=(1.6e-19)/(9.1e-31)
c    ak1 is e/m. If charged particles other than electrons are used,
c    ak1 must reflect proper charge to mass ratio.
         u=2.54/100
c    Mult by u converts inches to meters, divide by u converts m to in.
c    Program runs in MKS units but print out is in inches.
c    Plate shape (x0,y0) is beginning and (x4,y4) is end.
         y0=u*.3
         y1=u*.34
         y2=u*.4
         y3=u*.55
         y4=u*.7
         x0=0
         x1=.2*u
         x2=.4*u
         x3=.7*u
         x4=1.0*u
c    s2 is distance to screen
         s2=12.0*u
         pout=0
c    pout = 0 for no long ray trace write file to be made
c    pout = 1 will write the long ray trace file
         rando=rrand( )
c    h will be randomized to eliminate harmonic interaction with
c    lines of charge
```

APPENDIX A-continued

```
         delta=.005
         v5=20000
         em8=−3000
c    delta is offset increment, v5 is beam voltage, em8 is plate volts.
         s3=10*u
c    just an initial value for s3 not critical for anything later
         em0=0
         em1=0
         em2=0
         em3=0
         em4=0
         g0=0
         g1=0
         g2=0
         g3=0
         g4=0
         n0=100
c    n0 is the number of iterations to settle charges on plates
c    n0 = 1000 gives almost 5 digit smoothness 2743xx +/− 1x or so
c    Use n0 = 100 to 1000 for normal computations.
         print*, "0     ",x0/u,y0/u,"This"
         print*, "1     ",x1/u,y1/u," is"
         print*, "2     ",x2/u,y2/u,"  the"
         print*, "3     ",x3/u,y3/u,"  plate"
         print*, "4     ",x4/u,y4/u,"    shape."
         print*, " "
         n=0
         do 100 i=1,300
             q(i)=3000
100  continue
c    f0 is max deviation of potential between charges
c    from potential found at end of 1st iteration
c    charges are not adjusted until second iteration
         print *, "iteration","   largest error","    at"
101  f0=0
         do 110 j=1,299
         x=(j−.5)*x4/299
     x6=x
     call y6ofx6
c    y6ofx6 finds y6(x6) for top plate. There are 300 charges on
c    each plate. The first, q(1) is at x=0 and the last is at x=x4.
c    Interval is x4/299.
c    Potential is calculated between each charge and its
c    nearest neighbors on each side. Charges are adjusted by a
c    factor larger than the error to speed convergence.
     y=y6
     p=0
         do 120 i=1,300
             x7=(i−1)*x4/299
     x6=x7
     call y6ofx6
     y7=y6
     r=((x−x7)**2+(y−y7)**2)**.5
     r1=((x−x7)**2+(y+y7)**2)**.5
     r1=1/r1
     r=1/r
     p=p+q(i)*(alog(r)−alog(r1))
c    p is potential at (x,y) due to all the charges at (x7,y7)
120      continue
c    no adjustment is made during n=0 calculations
     if (n .le. .5) then
       p4=p
     endif
     f1=(p4−p)/p4
     if ((f1**2) .ge. (f0**2)) then
       f0=f1
       j1=j
     endif
     q(j)=q(j)*(f1*3.8+1)
     q(j+1)=q(j+1)*(f1*3.8+1)
     if ((n+1) .ge. n0) then
c        print*,j,p
     endif
110  continue
     n=n+1
     print *,n,f0,j1
c    n is relaxation iteration number, f0 is worst fractional error at
c    line-charge number j1
     if (n .lt. n0) then
```

APPENDIX A-continued

```
        goto 101
      endif
      do 150 i=1,300
      q(i)=q(i)*em8/p4
c    previous statement is only place where plate voltage appears
150 continue
180 continue
c    Following "do 158" statement is used when finding best focus.
c    Or if focus is set to zero, then all entering rays are parallel.
c    Use one way or the other. Need to also adjust the beam width.
        do 158 focus=-.01,.02000,.0005
c    focus=0
        print *, "beam, plate, focus:", v5, em8, focus
        print *, " "
c    now begins the ray tracing part
c    h is time interval in seconds of ray trace
182 continue
        s4=s3
        c3=1
        c4=u
c    next steps give starting position of electron
        n6=0
        do 155 ystart = 0.100*u,.15001*u,delta*u
        y = ystart
        xstart = -.01
        x = xstart
        rando=md( )
        h=(.5 +rando*.3)*1e-13
        n6=n6+1
        print *, " "
        print *, "start at" ,x/u,y/u,"h is",h
c    next step is starting velocity m/sec relativistically correct
151 v=2.9979e8*(1-1/(1+v5/511000)**2)**.5
        angle ((ystart/u-.125)/.025)*focus
        v1 = v * cos(angle)
        v2 = v * sin(angle)
        print *, "injection v2/v1 is", v2/v1
c    next program calculates fields E1 and E2 at x,y due to lines of
c    charge at x7, +/- y7
170 continue
        e1=0
        e2= 0
        do 152 i=1,300
        x6=(i-1)*x4/299
        call y6ofx6
        x7=x6
        y7=y6
        r3=(x-x7)2+(y-y7)2
        r4=(x-x7)2+(y+y7)2
        E1=e1+q(i)*(x7-x)*(1/r3-1/r4)
        E2=e2+q(i)*((y7-y)/r3+(y7+y)/r4)
152 continue
        v1=v1+e1*h*ak1
        v2=v2+e2*h*ak1
        x=x+v1*h
        y=y+v2*h
        if (pout .lt. .5) then
         goto 169
        endif
c    above goto 169 will skip long write and print of raytrace
        if (x .gt. x4) then
            write (1,*)E1,',',E2,',',v2/v1,',',x/u,',',y/u
            write (2,*) x/u,',',y/u,',',1
            goto 169
        endif
        if (x .lt. 0) then
            write (1,*)E1,',',E2,',',v2/v1,',',x/u,',',y/u
            write (2,*) x/u,',',y/u,',',1
            goto 169
        endif
        x6=x
        call y6ofx6
        write (1,*)E1,',',E2,',',v2/v1,',',x/u,',',y/u
        write (2,*) x/u,',',y/u,',',y6/u
169 continue
        if (x .gt. x4) then
        goto 153
        else if (x .lt. 0) then
        goto 153
        endif
        x6=x
        call y6ofx6
        c4=y6-y
        if (c4 .ge. c3) then
        goto 154
        endif
        c3=c4
        d3=x
154 if (y .ge. y6) then
        print *, "hit plate at",x/u
        write (4,*) 'hit plate at,',x/u
        goto 155
        endif
153 if (x .gt. x4+.03) then
        goto 156
        endif
176 continue
        if (x .lt. x0) then
        goto 160
        endif
        if (g0 .gt. .5)then
        goto 161
        endif
        em0=c4
        g0=1
161 if (x .lt. xI)then
        goto 164
        endif
        if (g1 .gt. .5)then
        goto 164
        endif
        em1=c4
        g1=1
164 if (x .lt. x2)then
        goto 162
        endif
        if (g2 .gt. .5)then
        goto 162
        endif
        em2=c4
        g2=1
162 if (x .lt. x3)then
        goto 163
        endif
        if (g3 .gt. .5)then
        goto 163
        endif
        em3=c4
        g3=1
163 if (x .lt. x4)then
        goto 160
        endif
        if (g4 .gt. .5)then
        goto 160
        endif
        em4=c4
        g4=1
160 continue
        goto 170
156 t4=v2/v1
171 continue
        print *, "distance to screen is", s2/u
        s3=y+t4*(s2-x)
        print *, "electron landed at deflection of ", s3/u
        print *, "at an angle of", atan (t4)
        write (3,*) ystart/u,',',s3/u,',',atan(t4),',',focus
183 continue
        s5=s3-s4
172 continue
        s4=s3
        s5 = abs(s5/(delta*u))
185 continue
        s6=s2-s3*v1/v2
        print *, "extrapolated center of 1st deflection is",s6/u
        s7=(s2-x4-.5*u-s6)*v2/v1
c    allows for half inch between 1st and 2nd deflection plates
        print *, "vertical deflection is",s7/u
        print *, "closest approach to plate is",c3/u,"at x=",d3/u
```

APPENDIX A-continued

```
        print *, "position    x      y     clearance"
        print *,
        print *, "entrance",x0/u,y0/u,em0/u
        print *, "first bend",x1/u,y1/u,em1/u
        print *, "second bend",x2/u,y2/u,em2/u
        print *, "third bend",x3/u,y3/u,em3/u
        print *, "exit    ",x4/u,y4/u,em4/u
177     continue
        em0=0
        em1=0
        em2=0
        em3=0
        em4=0
        g0=0
        g1=0
        g2=0
        g3=0
        g4=0
155     continue
158     continue
        end
        subroutine y6ofx6
        common q(300),x0,y0,x1,y1,x2,y2,x3,y3,x4,y4,x6,y6,x8,y8,x9,y9
        if (x6 .gt. x3)then
        goto 135
            else if (x6 .gt. x2)then
        goto 136
            else if (x6 .gt. x1)then
        goto 137
        endif
        y8=y0
        x8=x0
        y9=y1
        x9=x1
        goto 138
135     y8=y3
        x8=x3
        y9=y4
        x9=x4
        goto 138
136     y8=y2
        x8=x2
        y9=y3
        x9=x3
        goto 138
137     y8=y1
        x8=x1
        y9=y2
        x9=x2
        goto 138
138     if (x8 .eq. x9)then
        goto 139
        endif
        y6=(x6-x8)*(y8-y9)/(x8-x9)+y8
        goto 140
139     y6=y8
140     end
```

APPENDIX B

```
c    Auto Focus Program.
c    © 1998 Michael W. Retsky, All Rights Reserved.
c    Depending on how program is set up, it will find best
c    offset position of entering beam or best focus and resulting spot
c    diameter. Input includes beam volts, plate volts, plate geometry,
c    distance to screen, beam width and will find best offset.
c    Using 300 lines of charge per inch.
c    Graphical output office\b1 and \b2 show ray relative to plate and
c    E1,E2 vs xaxis and v2/v1 vs xaxis
c    \b3 has ystart, deflection . . . \b4 has plate information and volts.
c    Language is Fortran 77 from Lahey Computer Systems, 702-831-2500
     common q(300),x0,y0,x1,y1,x2,y2,x3,y3,x4,y4,x6,y6,x8,y8,x9,y9
     open(1, 'C:\office\b1.txt', access = 'sequential', status='old')
     open(2, 'C:\office\b2.txt', access = 'sequential', status='old')
     open(3, 'C:\office\b3.txt', access = 'sequential', status='old')
     open(4, 'C:\office\b4.txt', access = 'sequential', status='old')
     open(5, 'C:\office\b5.txt', access = 'sequential', status='old')
c    For first use of this program, insert "new" instead of "old".
     ak1=(1.6e-19)/(9.1e-31)
c    ak1 is e/m
     u=2.54/100
c    Mult by u converts inches to meters, divide by u converts m to in.
c    Program runs in MKS units but print out is in inches.
c    Plate shape (x0,y0) is beginning and (x4,y4) is end.
     y0=u*.3
     y1=u*.34
     y2=u*.4
     y3=u*.55
     y4=u*.7
     x0=0
     x1=.2*u
     x2=.4*u
     x3=.7*u
     x4=1.0*u
     do 404 cent = -0.04, .200001, .02
```

APPENDIX B-continued

```
c     s2 is distance to screen
          s2=12.0*u
          pout=0
c     pout = 0 for no long ray trace write file to be made
c     pout = 1 will write the long ray trace file
          rando=rrand()
c     h will be randomized to eliminate harmonic interaction with
c        lines of charge
c     aberdisk is best focused beam diameter
          aberdisk = 100
c     aberdisk starts off set at a high initial value
c     cent is injection offset central point of beam
          focus1 = .0
          focus2 = 0.01
          focus3 = (focus2-focus1)/4
c     focus1,2,3 are low,high,step of focus do-loop
          delta = .002
          v5=20000
          em8 = 8000
c     delta is offset increment, v5 is beam voltage, em8 is plate volts.
          s3=10*u
c     just an initial value for s3 not critical for anything later
          em0=0
          em1=0
          em2=0
          em3=0
          em4=0
          g0=0
          g1=0
          g2=0
          g3=0
          g4=0
          n0=100
c     n0 is the number of iterations to settle charges on plates
c     n0 = 1000 gives almost 5 digit smoothness 2743xx +/- 1x or so
c     Use n0 = 100 to 1000 for normal computations.
          print*, "0     ",x0/u,y0/u," This"
          print*, "1     ",x1/u,y1/u," is"
          print*, "2     ",x2/u,y2/u," the"
          print*, "3     ",x3/u,y3/u," plate"
          print*, "4     ",x4/u,y4/u," shape."
          print*, " "
          n=0
              do 100 i=1,300
                  q(i)=3000
100       continue
c     f0 is max deviation of potential between charges
c     from potential found at end of 1st iteration
c     charges are not adjusted until second iteration
          print *, "iteration","     largest error","     at"
101       f0=0
              do 110 j=1,299
                  x=(j-.5)*x4/299
          x6=x
          call y6ofx6
c     y6ofx6 finds y6(x6) for top plate. There are 300 charges on
c     each plate. The first, q(1) is at x=0 and the last is at x=x4.
c     Interval is x4/299.
c     Potential is calculated between each charge and its
c     nearest neighbors on each side. Charges are adjusted by a
c     factor larger than the error to speed convergence.
          y=y6
          p=0
              do 120 i=1,300
                  x7=(i-1)*x4/299
          x6=x7
          call y6ofx6
          y7=y6
          r=((x-x7)**2+(y-y7)**2)**.5
          r1=((x-x7)**2+(y+y7)**2)**.5
          r1=1/r1
          r=1/r
          p=p+q(i)*(alog(r)-alog(r1))
c     p is potential at (x,y) due to all the charges at (x7,y7)
120       continue
c     no adjustment is made during n=0 calculations
          if (n .le. .5) then
              p4=p
          endif
```

APPENDIX B-continued

```
              f1=(p4-p)/p4
              if ((f1**2) .ge. (f0**2)) then
                  f0=f1
                  j1=j
              endif
              q(j)=q(j)*(f1*3.8+1)
              q(j+1)=q(j+1)*(f1*3.8+1)
              if ((n+1) .ge. n0) then
c                 print *,j,p
              endif
110       continue
              n=n+1
              print *,n,f0,j1
c     n is relaxation iteration number, f0 is worst fractional error at
c     line-charge number j1
              if (n .lt. n0) then
              goto 101
                  endif
              do 150 i=1,300
              q(i)=q(i)*em8/p4
c     write (5,*) i, ",", q(i)
c     previous statement is only place where plate voltage appears
150       continue
180       continue
c     do 404 cent = .09, .110001, .01
              do 404 ifocus=1,8
c     above ifocus normally set 5 to 10
c     Following "do 158" statement is used when finding best focus.
c     Or if focus is set to zero, then all entering rays are parallel.
c     Use one way or the other. Need to also adjust the beam width.
              do 158 focus = focus1, focus2 +.00000001, focus3
              amaxim = -100
              aminim = 100
              print *, "beam, plate, focus: ", v5, em8, focus
              print *, " "
c     now begins the ray tracing part
c     h is time interval in seconds of ray trace
182       continue
                  s4=s3
                  c3=1
                  c4=u
c     next steps give starting position of electron
c     temp change beam width to 0.070 in next step
c     temp commenting out below do 155
              do 155 ystart = (cent-.025)*u,(cent+.000001+.025)*u, 0.0125*u
              y = ystart
              xstart = -.01
              x = xstart
              rando=rnd()
              h=(.5 +rando* .3)*1e-13
c     above h may be temporarily increased
              print *, "       IFOCUS, aberdisk: ",ifocus,aberdisk
              print *, "start at ",x/u,y/u," h is",h
c     next step is starting velocity m/sec relativistically correct
151   v=2.9979e8*(1-1/(1+v5/511000)**2)**.5
c     temp change beam width in next statement
              angle = (((ystart/u)-cent)/(.050/2)) * focus
              print *, "angle is ",angle
              v1 = v * cos(angle)
              v2 = v * sin(angle)
              print *, "injection v2/v1 is ", v2/v1
c     next program calculates fields E1 and E2 at x,y due to lines of
c     charge at x7, +/- y7
170       continue
              e1=0
              e2=0
              do 152 i=1,300
                  x6=(i-1)*x4/299
              call y6ofx6
              x7=x6
              y7=y6
              r3=(x-x7)2+(y-y7)2
              r4=(x-x7)2+(y+y7)2
              E1=e1+q(i)*(x7-x)*(1/r3-1/r4)
              E2=e2+q(i)*((y7-y)/r3+(y7+y)/r4)
152       continue
              v1=v1+e1*h*ak1
              v2=v2+e2*h*ak1
              x=x+v1*h
```

APPENDIX B-continued

```
                y=y+v2*h
c       next print is temp for checking rays
c       print *, x,y,v1,v2
                if (pout .lt. .5) then
                    goto 169
                endif
c       above goto 169 will skip long write and print of raytrace
                if (x .gt. x4) then
c                   write (1,*) E1,',',E2,',',v2/v1,',',x/u,',',y/u
                        write (2,*) x/u,',',y/u,',',2
                        goto 169
                endif
                if (x .lt. 0) then
c                   write (1,*) E1,',',E2,',',v2/v1,',',x/u,',',y/u
                        write (2,*) x/u,',',y/u,',',2
                        goto 169
                endif
                x6=x
                call y6ofx6
c       write (1,*) E1,',',E2,',',v2/v1,',',x/u,',',y/u
                write (2,*) x/u,',',y/u,',',y6/u
169     continue
                if (x .gt. x4) then
                goto 153
                else if (x .lt. 0) then
                goto 153
                endif
                x6=x
                call y6ofx6
                c4=y6-y
                if (c4 .ge. c3) then
                goto 154
                endif
                c3=c4
                d3=x
154     if (y .ge. y6) then
                    print *, "hit plate at ",x/u
                        write (4,*) 'hit plate at,',x/u
                goto 155
                endif
153     if (x .gt. x4+.03) then
                goto 156
                endif
176     continue
                if (x .lt. x0) then
                goto 160
                endif
                if (g0 .gt. .5) then
                goto 161
                endif
                em0=c4
                g0=1
161     if (x .lt. x1) then
                goto 164
                endif
                if (g1 .gt. .5) then
                goto 164
                endif
                em1=c4
                g1=1
164     if (x .lt. x2) then
                goto 162
                endif
                if (g2 .gt. .5) then
                goto 162
                endif
                em2=c4
                g2=1
162     if (x .lt. x3) then
                goto 163
                endif
                if (g3 .gt. .5) then
                goto 163
                endif
                em3=c4
                g3=1
163     if (x .lt. x4) then
                goto 160
                endif
```

APPENDIX B-continued

```
              if (g4 .gt. .5) then
         goto 160
              endif
              em4=c4
              g4=1
160      continue
              goto 170
156      t4=v2/v1
171      continue
c    print *, "distance to screen is ", s2/u
              s3=y+t4*(s2-x)
              print *, "electron landed at deflection of ", s3/u
              print *, "at an angle of ", atan (t4)
              write (3,*) ystart/u,',',s3/u,',',atan(t4),',',focus
              amaxim = amax1 (amaxim,s3/u)
              aminim = amin1 (aminim,s3/u)
c
183      continue
              s5=s3-s4
172      continue
              s4=s3
              s5 = abs(s5/(delta*u))
185      continue
              s6=s2-s3*v1/v2
c    print *, "extrapolated center of 1st deflection is ",s6/u
              s7=(s2-x4-.5*u-s6)*v2/v1
c    allows for half inch between 1st and 2nd deflection plates
c    print *, "vertical deflection is ",s7/u
              print *, "closest approach to plate is",c3/u," at x= ",d3/u
              print *, "position      x      y      clearance"
              print *,
              print *, "entrance   ",x0/u,y0/u,em0/u
              print *, "first bend ",x1/u,y1/u,em1/u
              print *, "second bend",x2/u,y2/u,em2/u
              print *, "third bend ", x3/u,y3/u,em3/u
              print *, "exit       ",x4/u,y4/u,em4/u
177      continue
              em0=0
              em1=0
              em2=0
              em3=0
              em4=0
              g0=0
              g1=0
              g2=0
              g3=0
              g4=0
155      continue
c    158      continue
              if (-aberdisk + (amaxim - aminim)) 401,402,403
401      bestfocus = focus
402      continue
403      continue
              aberdisk = amin1 (amaxim-aminim, aberdisk)
              print *, "maximum is", amaxim
              print *, "minimum is", aminim
              print *, "aber disk is", amaxim - aminim
              print *, "at focus of", focus
              write (4,*) amaxim-aminim, ", ", focus, ", ", ifocus, ", ", cent
              print *, "best focused aberdisk so far is", aberdisk
              print *, "at", bestfocus
158      continue
c    goto 404
c    above temp bypass to get inflection point
              if ((aberdisk -.05) .LT. 0) then
                   temp1 = focus1
                   temp2 = focus2
                   focus1 = bestfocus - .5* .3*(temp2 - temp1)
                   focus2 = bestfocus + .5* .3*(temp2 - temp1)
                   focus3 = (focus2 - focus1)/4
              endif
              if ((aberdisk-.05) .GE. 0) then
                   temp1 = focus1
                   temp2 = focus2
                   focus1 = bestfocus - .5*(temp2 - temp1)
                   focus2 = bestfocus + .5*(temp2 - temp1)
                   focus3 = (focus2 - focus1)/4
              endif
404      continue
```

APPENDIX B-continued

```
            end
            subroutine y6ofx6
            common q(300),x0,y0,x1,y1,x2,y2,x3,y3,x4,y4,x6,y6,x8,y8,x9,y9
            if (x6 .gt. x3) then
        goto 135
            else if (x6 .gt. x2) then
        goto 136
            else if (x6 .gt. x1) then
        goto 137
            endif
            y8=y0
            x8=x0
            y9=y1
            x9=x1
            goto 138
135     y8=y3
            x8=x3
            y9=y4
            x9=x4
            goto 138
136     y8=y2
            x8=x2
            y9=y3
            x9=x3
            goto 138
137     y8=y1
            x8=x1
            y9=y2
            x9=x2
            goto 138
138     if (x8 .eq. x9) then
            goto 139
            endif
            y6=(x6-x8)*(y8-y9)/(x8-x9)+y8
            goto 140
139     y6=y8
140     end
```

I claim:

1. Apparatus for deflecting and focusing a charged particle stream by injecting the stream between a first pair of symmetrical deflection plates, comprising:
    a particle source, the particle source operative to aim the particle stream in a substantially undeflected condition at a position offset from a position equidistant between the first pair of symmetrical deflection plates, the offset position being at a predetermined location based upon stream deflection and stream offset characteristics, wherein the predetermined location comprises a vicinity of an inflection point on a deflection versus offset curve;
    at least one deflection stage disposed prior to a defining aperture, the at least one deflection stage and defining aperture to successively bend the particle stream and filter the particle stream to reduce an electron energy spread thereof;
    a variable quadrupole and focus lens disposed prior to deflection, the variable quadrupole and focus lens to dynamically adjust for particle stream astigmatism and focus the stream; and
    a target disposed substantially orthogonal to the particle stream, the stream to impact the target.

2. The apparatus defined in claim 1, wherein the at least one deflection stage comprises a plurality of deflection stages.

3. A reduced footprint cathode ray tube, comprising:
    an electron gun, the electron gun mounted to other than along a line of sight toward a cathode ray tube screen and emitting an electron beam;
    a plurality of deflection stages disposed prior to a defining aperture, the plurality of deflection stages and defining aperture to successively bend the electron beam and filter the electron beam to reduce an electron energy spread thereof;
    a pair of symmetrical deflection plates, the pair of symmetrical deflection plates disposed after the defining aperture operative to aim the electron beam in a substantially undeflected condition at a position offset from a position equidistant between a second pair of symmetrical deflection plates, the offset position being at a predetermined location based upon stream deflection and stream offset characteristics, wherein the predetermined location comprises a vicinity of an inflection point on a deflection versus offset curve;
    a variable quadrupole and focus lens disposed prior to deflection, the variable quadrupole and focus lens to dynamically adjust for electron beam astigmatism and focus the electron beam; and
    a fluorescent phosphor screen disposed substantially orthogonal to the electron beam at the point of impact of the electron beam.

4. Apparatus for filtering the energy spread of a charged particle stream and deflecting the stream comprising:
    a particle source, the particle source operative to aim the particle stream in a substantially undeflected condition offset between at least one pair of symmetrical deflection plates, the offset position being at a predetermined location based upon stream deflection and stream offset characteristics, wherein the predetermined location comprises the vicinity of an inflection point on a deflection versus offset curve;
    an aperture disposed downstream from the at least one pair of deflection plates, the aperture to intercept charged particles with undesirable energy values;

a variable quadrupole disposed prior to deflection, the variable quadrupole to adjust for particle beam astigmatism; and a target disposed substantially orthogonal to the stream, the stream to impact the target.

5. The apparatus defined in claim 4, further comprising a variable focus lens disposed prior to deflection, the variable focus lens to focus the particle beam.

6. The apparatus defined in claim 4, wherein a first plate of the at least one pair of deflection plates comprises an electrically equivalent plate that assumes the shape and voltage of the corresponding equipotential surface.

7. The apparatus defined in claim 4, wherein the predetermined offset location comprises a vicinity of a point determined from a deflection aberration diameter disk plotted versus beam injection offset curve.

8. The apparatus defined in claim 4 disposed as an exit stage of an electron gun for a CRT.

9. The apparatus defined in claim 8, further comprising a second deflection plate pair disposed downstream from the aperture, the second deflection plate pair to dynamically adjust the injection offset of a subsequent CRT deflection scanning device.

10. The apparatus defined in claim 4, wherein the at least one deflection plate pair comprises a plurality of deflection plate pairs.

11. The apparatus defined in claim 10, wherein the plurality of deflection plate pairs deflect the charged particle stream into a plurality of different directions.

12. The apparatus defined in claim 4, wherein the apparatus comprises plural apparatuses positioned in the path of the charged particle stream.

13. The apparatus defined in claim 4, further comprising a detector with spatial resolution capabilities disposed at an exit of the apparatus.

14. The apparatus defined in claim 4 disposed in a mass spectrometer.

15. Apparatus for filtering the energy spread of a charged particle beam and deflecting the beam comprising:

a particle source, the particle source operative to aim the particle stream in a substantially undeflected condition offset between at least one pair of symmetrical deflection plates, the offset position being at a predetermined location based upon stream deflection and stream offset characteristics an aperture disposed downstream from the at least one pair of deflection plates, the aperture to intercept charged particles with undesirable energy values; and a variable quadrupole and focus lens disposed prior to deflection, the variable quadrupole and focus lens to adjust for particle stream astigmatism and focus the stream.

16. The apparatus defined in claim 15, wherein a first plate of the at least one pair of deflection plates comprises an electrically equivalent plate that assumes the shape and voltage of the corresponding equipotential surface.

* * * * *